(12) United States Patent
House et al.

(10) Patent No.: US 6,964,577 B1
(45) Date of Patent: Nov. 15, 2005

(54) DUAL STAGE LATCH AND RELEASE MECHANISM

(75) Inventors: Kenneth W. House, Ft. Collins, CO (US); Douglas P. Collins, Ft. Collins, CO (US); Frank M. Dodge, Berthoud, CO (US); Kevin L. Van Liere, Westminster, CO (US); Jason A. Hoyt, Loveland, CO (US)

(73) Assignee: Everett Charles Technology Inc., Pomona, CA (US)

( * ) Notice: Subject to any disclaimer, the term of this patent is extended or adjusted under 35 U.S.C. 154(b) by 0 days.

(21) Appl. No.: 10/795,942

(22) Filed: Mar. 8, 2004

Related U.S. Application Data

(60) Provisional application No. 60/452,733, filed on Mar. 7, 2003.

(51) Int. Cl.⁷ ............................................. H01R 13/62
(52) U.S. Cl. ....................................................... 439/157
(58) Field of Search ........................... 439/157, 54, 912, 439/266; 324/158, 754, 755; 29/464, 468, 29/33.5; 438/622, 687; 248/181, 544; 257/522, 257/762; 310/12–15; 92/88

(56) References Cited

OTHER PUBLICATIONS

Drawings of previous version of invention, sold in Jun. of 2002.

*Primary Examiner*—Alexander Gilman
(74) *Attorney, Agent, or Firm*—Margaret Polson; Patent Law Offices of Rick Martin, P.C.

(57) ABSTRACT

The present invention is a dual stage latch assembly with a cam follower pin mounted on a spring-tensioned arm, especially useful for vacuum test fixtures for printed circuit boards. The arm is spring-loaded on both sides, so that the arm is always biased to the upright and neutral position, regardless of which direction the arm is pivoted. A catch is provided to define the path of the cam pin and to hold the cam in certain positions. The cam pin follows a defined path around the catch, creating a first closed stage, a first release position, a second closed stage and a final release position.

8 Claims, 24 Drawing Sheets

DUAL STAGE LATCH AND RELEASE MECHANISM

CROSS REFERENCE APPLICATIONS

This application is a non-provisional application claiming the benefits of provisional application No. 60/452,733 filed Mar. 7, 2003.

FIELD OF INVENTION

The present invention relates to release mechanisms for test fixtures for printed circuit assemblies. More particularly, it relates to a dual stage mechanism to allow the automatic use of two different sets of testing pins in the same vacuum powered fixture.

BACKGROUND OF THE INVENTION

It is well known in the art to test printed circuit assemblies (PCA) in test fixtures which are vacuum powered. The positions on the PCA to be tested are lined up with a set of test probes in a test fixture. The pins are specifically positioned to test a given PCA design. It is often desirable to test two sets of positions on the PCA, a first set and a second set. In order to allow this it is known in the art to have dual height probes which are spring loaded and can be depressed downward. This allows the user to have a first set of pins, dual stage pins, which co tact the PCA in the first position and a second set, with a height smaller than the first set. The PCA can be tested on the first set and then depressed downward, compressing the first set of pins, until the second set of pins is also contacted. Or this can be done in reverse, with all the pins contacting first and the PCA being moved upward so that only the first set of pins are in contact. There is presently no self-actuating automatic, mechanical way to accomplish this for vacuum fixtures. What is needed is a self-actuating automatic release mechanism which provides for dual stage release of the test assembly, allowing for two stage testing.

SUMMARY OF THE INVENTION

The primary aspect of the present invention is to provide a dual stage latch and release mechanism which provides for automatic release of the test fixture from a first fully closed position, to a second position, back to the fully closed position and then releasing the dual stage latch mechanism, allowing the test fixture to be opened. A multiple of these mechanisms may be used in a fixture. Typically, but not limited to, four latches are used on one test fixture with one in each corner.

Other aspects of this invention will appear from the following description and appended claims, reference being made to the accompanying drawings forming a part of this specification wherein like reference characters designate corresponding parts in the several views.

The present invention has a latch assembly with a cam follower pin mounted on a spring tensioned arm. The arm is spring-loaded on both sides, so that the arm is always biased to the upright, neutral position, regardless of which direction the arm is pivoted. A catch is provided to define the path of the cam follower pin and to hold the cam in certain positions. The cam pin follows a defined path around the catch, creating a first closed stage, a first release position, a second closed stage and a final release position.

Before explaining the disclosed embodiment of the present invention in detail, it is to be understood that the invention is not limited in its application to the details of the particular arrangement shown, since the invention is capable of other embodiments. Also, the terminology used herein is for the purpose of description and not of limitation.

DETAILED DESCRIPTION OF THE DRAWINGS

Figure 24:
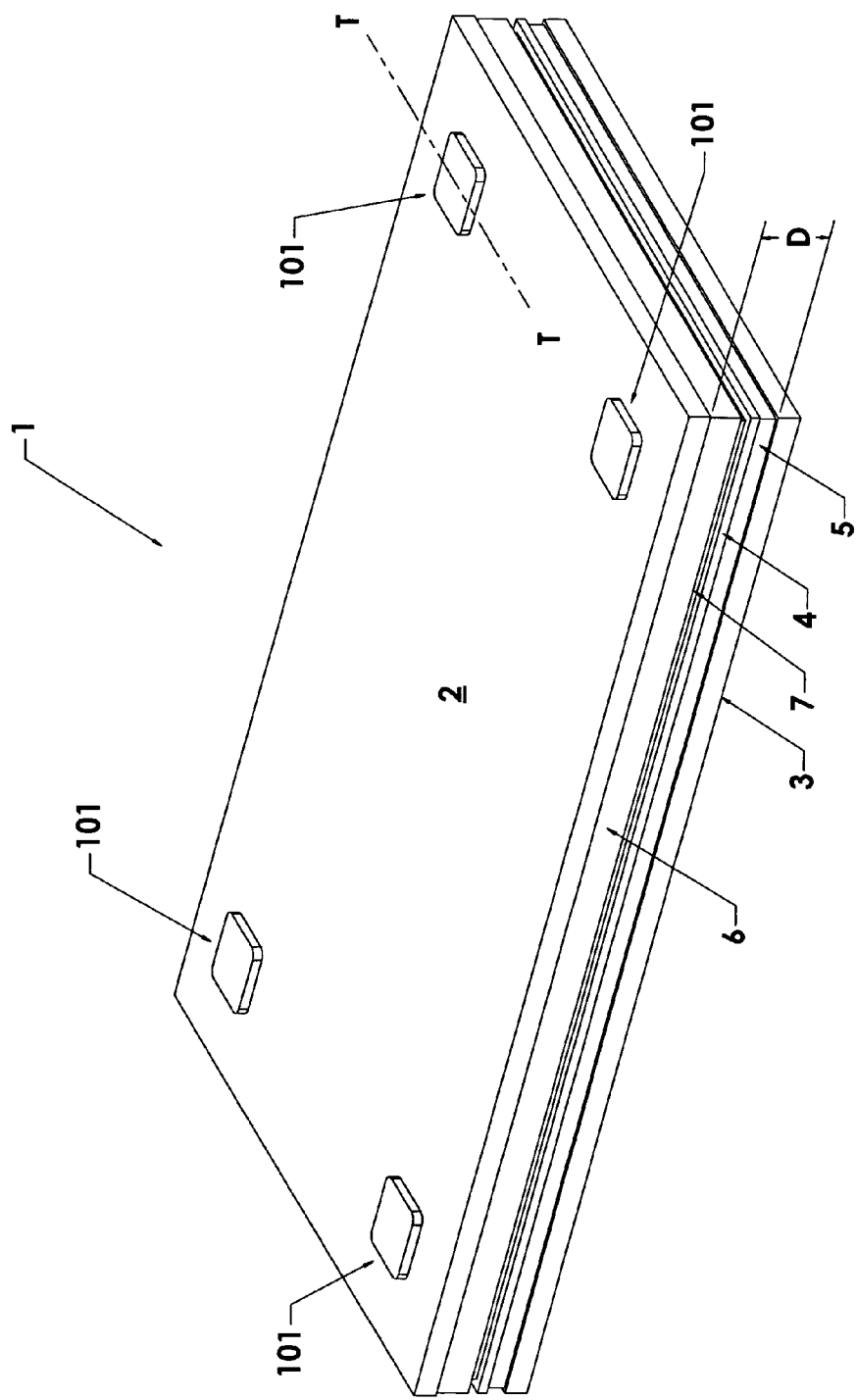
FIG. 24 is a simplified, schematic view of a test fixture.

As shown in most of the figures, the test fixture 1 has a top plate 2, a probe plate 3, and a support plate 4. The support plate 4 may be separated from the probe plate 3 by a spring gasket 5, and other supporting devices not pertinent to this description. The gate 6 and a gasket 7 support the top plate 2. The support plate 4 has a guide plate 8 on which the PCA 9 is set. FIG. 24 shows a simplified, schematic drawing of a test fixture 1. The entire test fixture 1 is generally rectangular in shape and the gaskets 5 and 7 extend all the way around the edge of the test fixture 1, allowing a vacuum seal to be formed. When a vacuum is created within the test fixture 1, the top plate 2 and the support plate 4 moves downward as atmospheric pressure pushes down on the plates, moving the plates 2, 4 downward toward the probe plate 3, compressing the gaskets 5 and 7, as shown in FIGS. 2, 4, 10, 12, 19, 25b, and 25d. As the formation of the vacuum and the sealing of the test fixture 1 are well known in the art, they will not be further discussed herein.

Probe pins 10, 11 are mounted in the probe plate 3 and extend through holes in the support plate 4 and guide plate 8. Probe pin 10 is a regular stroke length spring loaded probe and probe pin 11 is a longer stroke length probe to act as a dual stage pin, which is spring loaded to allow it to touch the PCA 9 at a height which is higher than that required by probe pin 10. Only two probe pins are shown in the drawings for simplicity. It is to be understood that in actual use far more pins would be in use, including types of pins not shown or discussed herein. The number and types of different probe pins and when and how to use the different types are well known in the art and are therefore not discussed herein.

Figure 25:
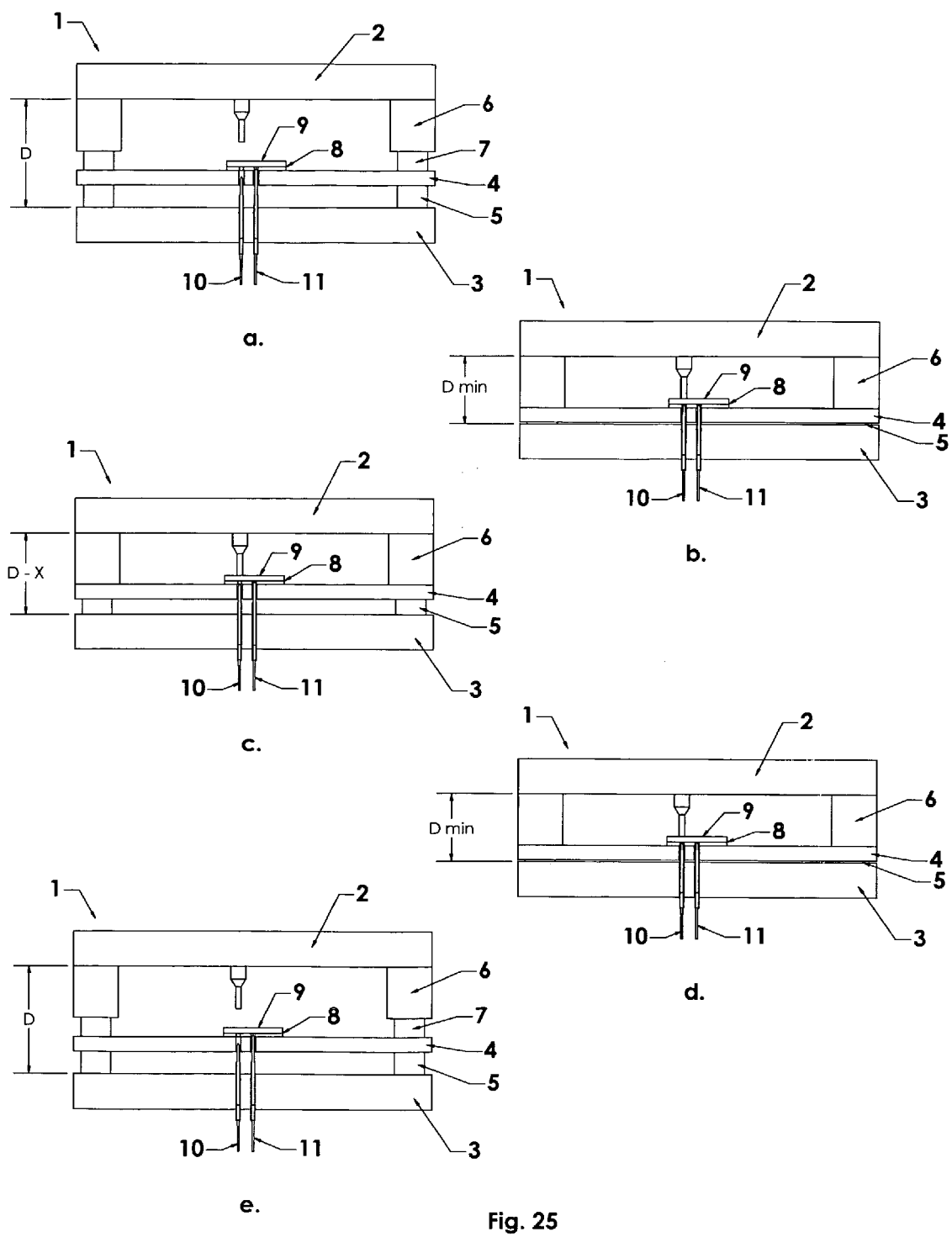
FIG. 25 is a sequential view of the test fixture during the dual stage testing process using the dual stage latch mechanism.

The overall movement of the test fixture 1 and the pins 10 and 11 in the present invention is shown in FIG. 25. In A the test fixture is in the starting position, with no vacuum and neither pin in contact with the PCA 9. The distance between plates 2 and 3 in this stage is D. In the next step, shown in B, the vacuum is applied, bringing the plates down, compressing the gaskets 7 and 5 and bringing both pin 10 and 11 in to contact with the desired points on PCA 9. This is the first closed stage and the first testing position. In this stage distance D is the smallest it will be during the operation of the test fixture 1 and is called Dmin or Dminimum. In the next stage, shown in C, the vacuum is released, moving the plates up. The dual stage latch mechanism 101 of the present invention, as will be described in detail below, holds the test fixture 1 at a first release stage, which is the second testing stage. In this position the distance between the plates 2 and 3 is set so that pin 10 is not in contact with PCA 9, but pin 11 is. This is the second testing stage, or the first release position. In this stage the distance D is D−x. X will be determined by the testing pins being used in any given application. In the next stage, shown in D, the vacuum in applied again, and the distance is again Dmin. This is the second closed stage and the beginning of the release of the latch 101. In the next stage, shown in E, the text fixture has returned to the starting position and distance D is again D.

Figure 1:
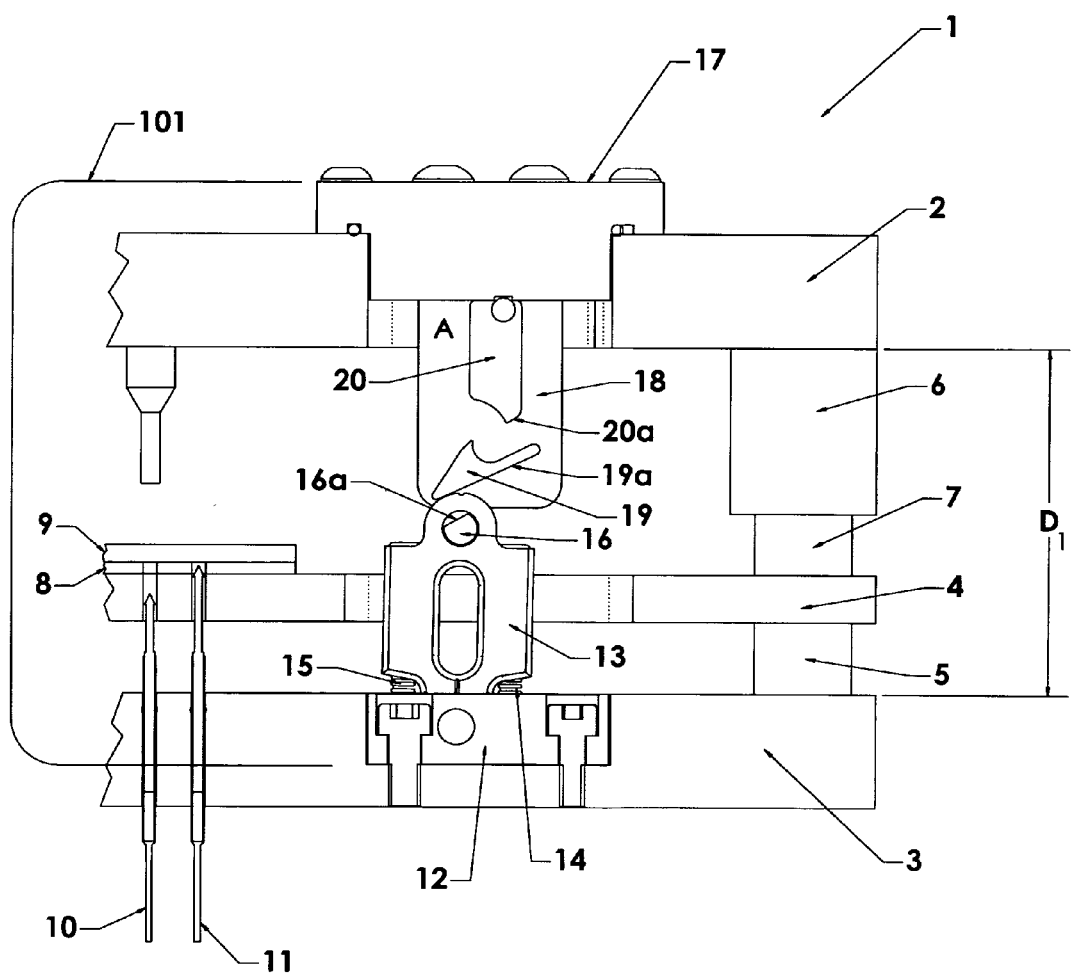
FIG. 1 is a partially cutaway view of the latch mechanism and test fixture in the neutral position.

As seen first in FIG. 1, the dual stage latch mechanism 101 has a pivot block 12 mounted in the probe plate 3. A cam arm 13 is pivotally mounted on the pivot block 12 by an axle, which prevents any substantial lateral movement. Springs 14, 15 continuously bias cam arm 13 to the neutral position shown in FIGS. 1, 6, 7, 8, 9, 14, 15, 16, 17, 18 and 20. In the first embodiment, the neutral position is about 1.5 degrees off vertical and is adjusted by set screws which bear upon the top of the spring. In order to reduce mass, material is removed from the mid-line area of the cam arm 13 to allow quicker action as cam arm 13 travels through the cam path shown on FIGS. 8 and 15.

Figure 6:
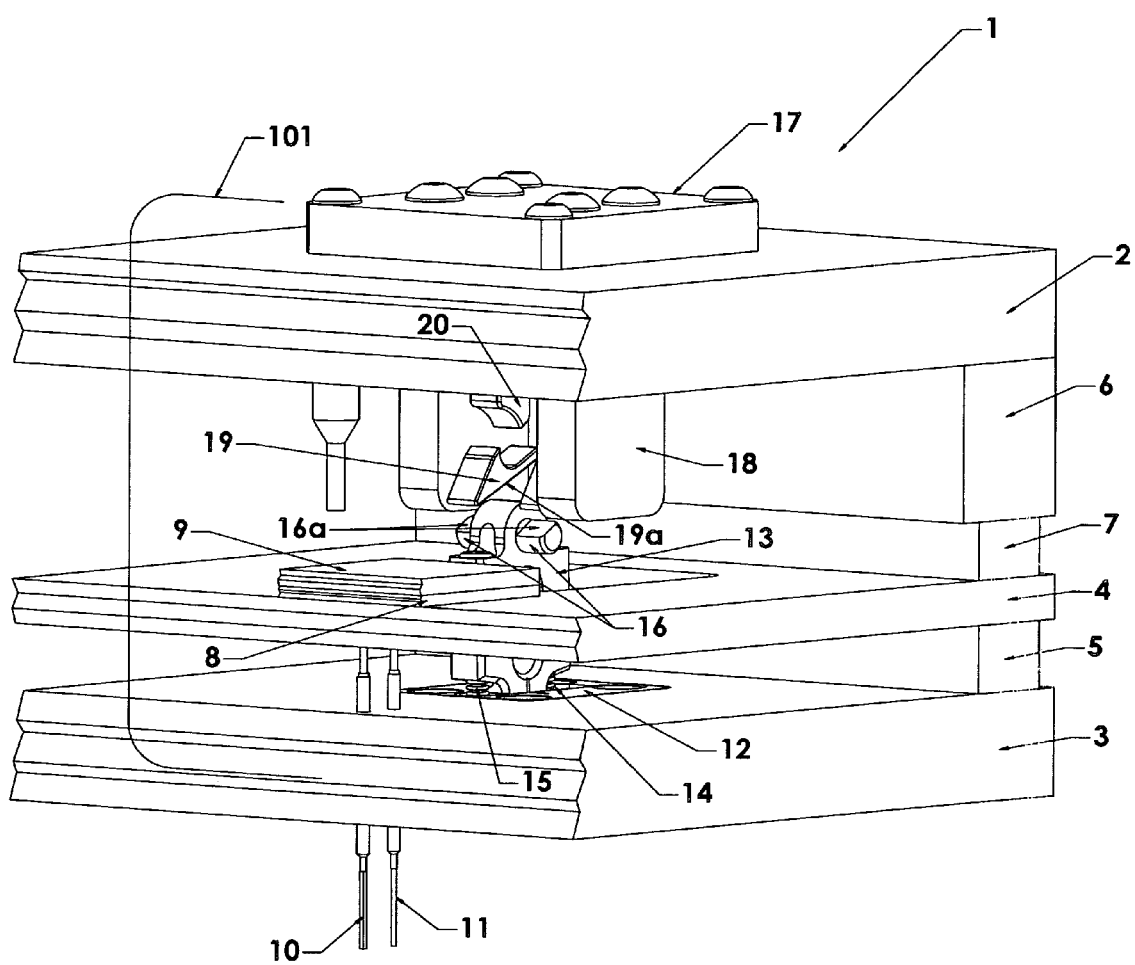
FIG. 6 is a perspective view of the latch mechanism and test fixture.
Figure 16:
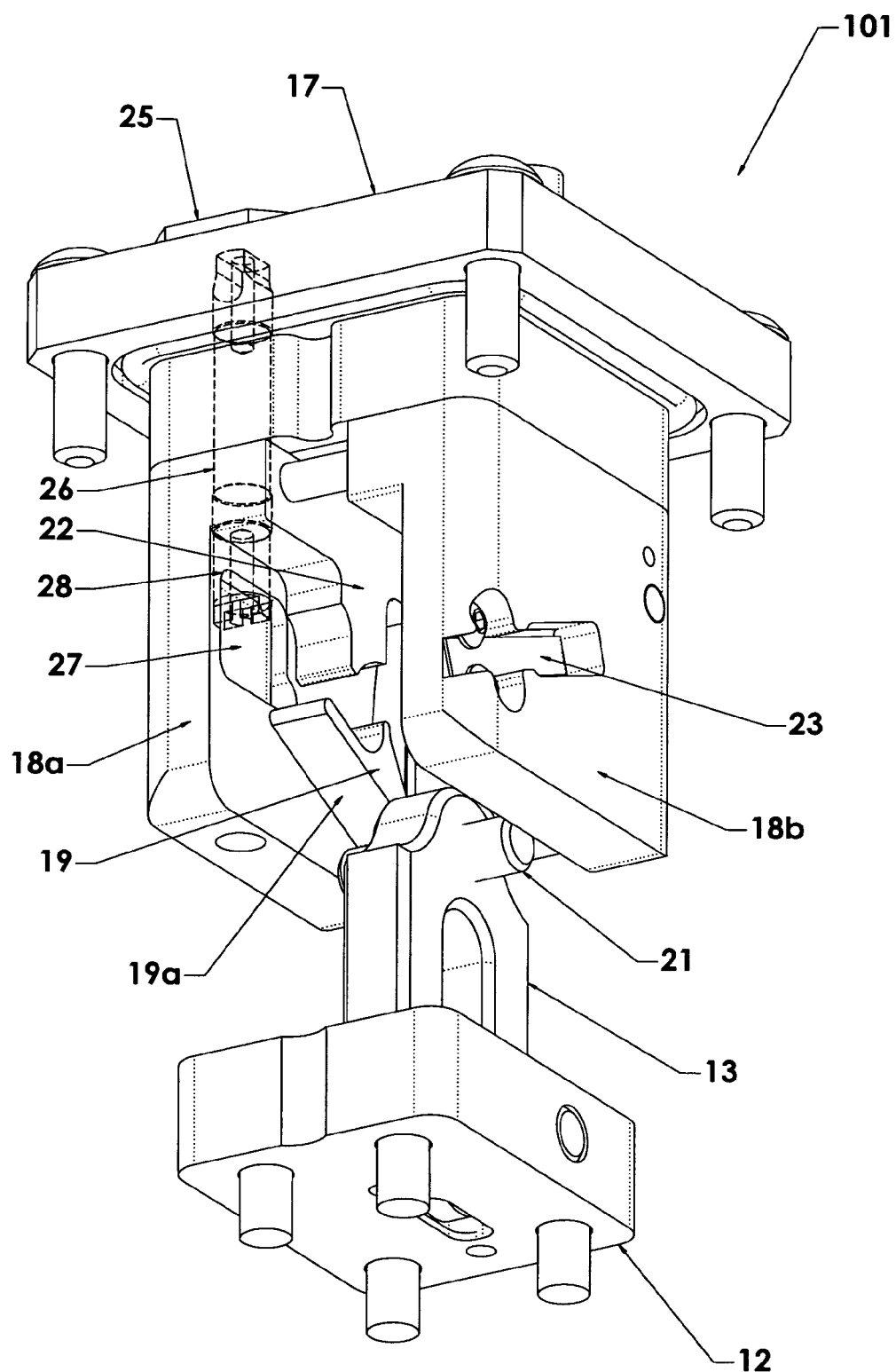
FIG. 16 is a perspective view of the latch mechanism with the stage selection switch in the dual stage position.
Figure 17:
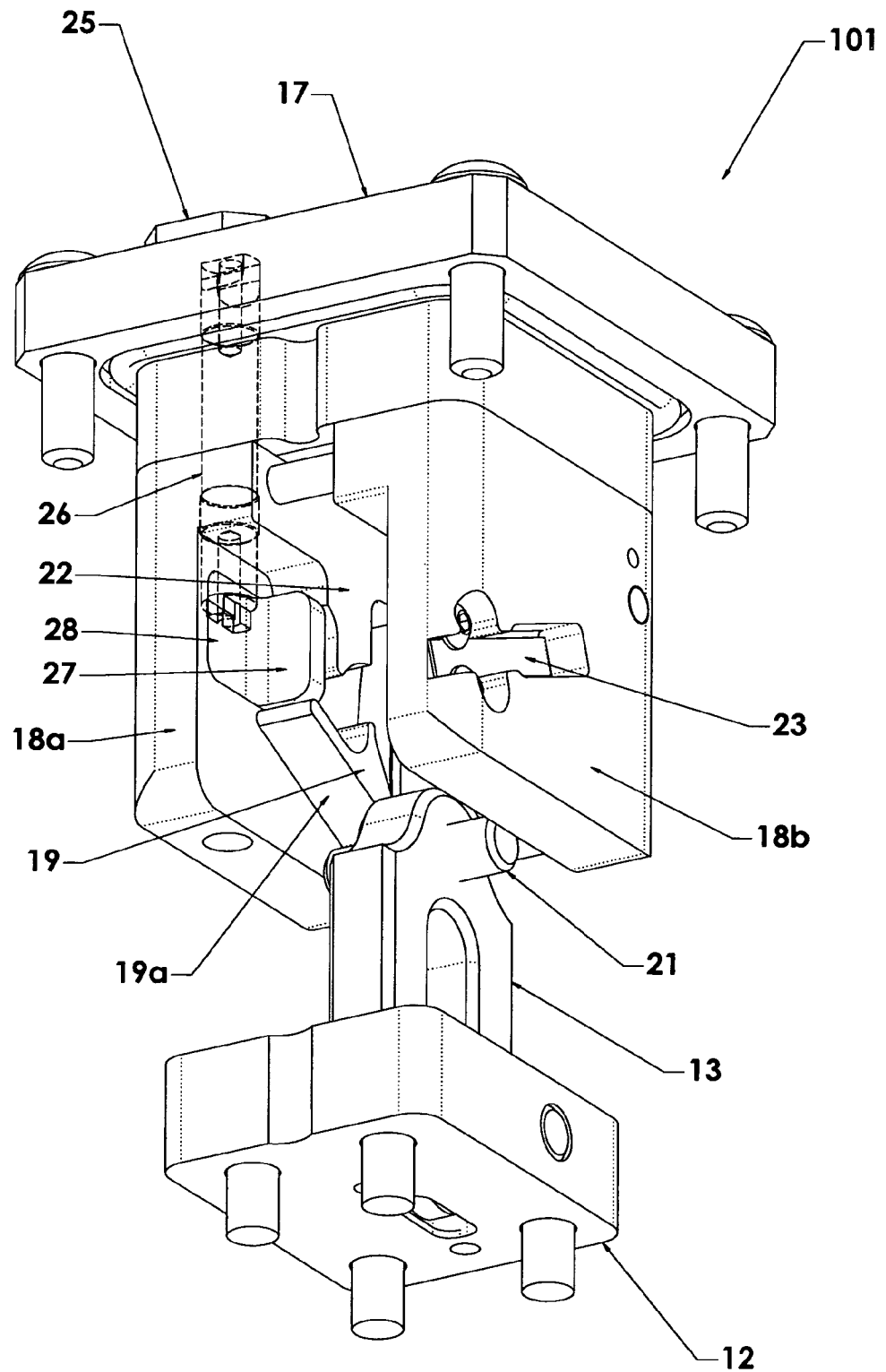
FIG. 17 is a perspective view of the latch mechanism with the stage selection switch in the single stage position.

As shown in FIG. 6 a cam follower pin 16 extends from each side of cam arm 13. Although most of the description herein will refer to the action of a single cam follower pin 16, it is to be understood that both ends of a cam follower pin 16 are acting identically at all times. A block mounting assembly 17 is attached to the top plate 2. Two matching latch arms 18 extend downward from the block mounting assembly 17 into the test fixture 1 and are substantially parallel to each other, as shown in FIGS. 6, 16 and 17. Latch pieces 19 and 20 are protruding features on the facing surfaces of latch arms 18. In the first embodiment the latch arms are engraved A and B for assembly purposes.

The views in FIGS. 1–5, 7 and 8 are simplified for ease of drawing and show interaction of the cam follower pin 16 and a single set of latch pieces 19, 20 in the first embodiment of latch 101. It is to be understood that the cam arm 13 is moving between the two latch arms 18 and the cam follower pins 16 are moving along two sets of latch pieces 19, 20, positioning the cam follower pin 16, and therefore the cam arm 13, between the latch arms 18, further preventing any substantial lateral movement.

Figure 7:
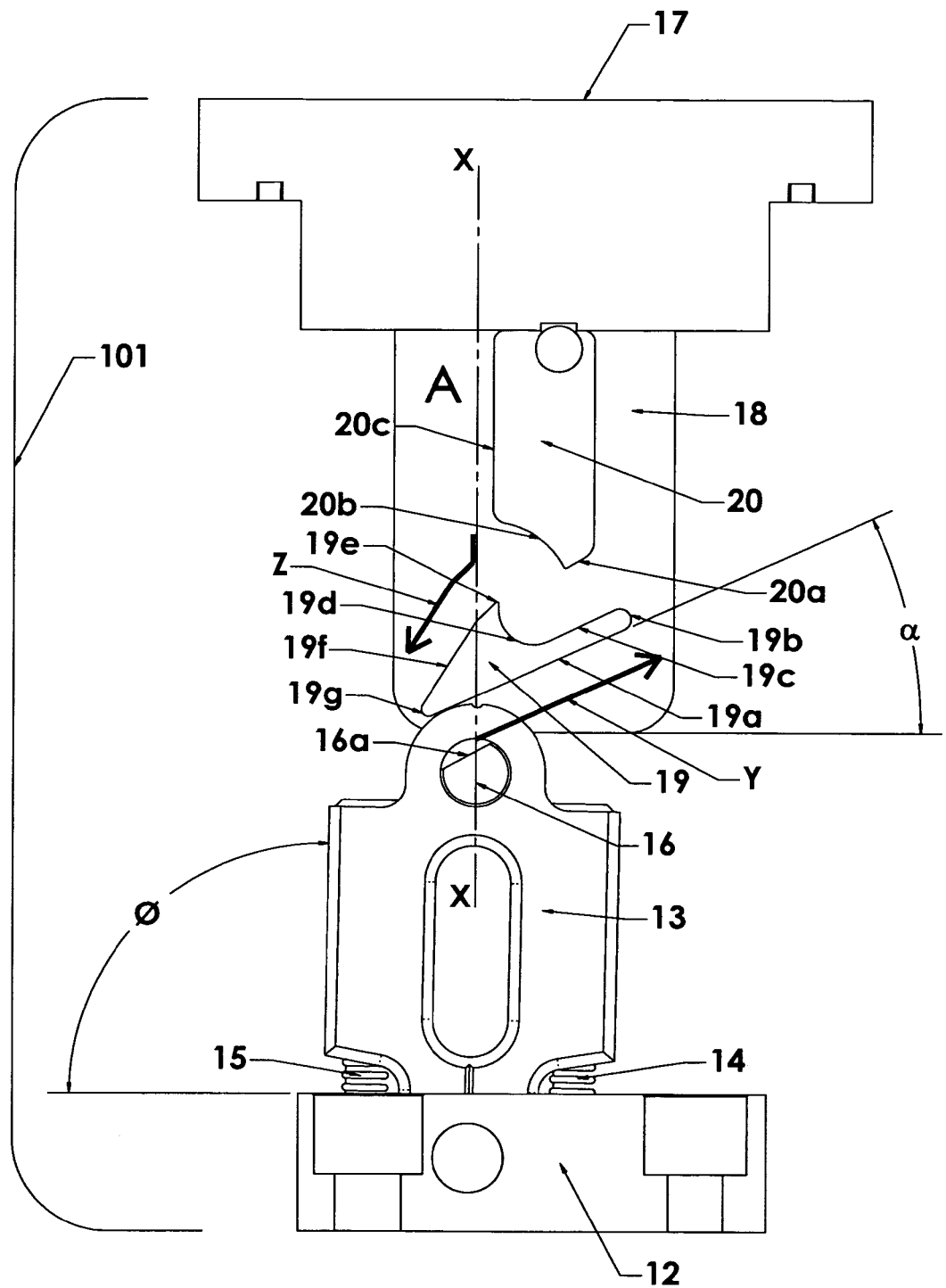
FIG. 7 is a detail view of the cam arm and catch.
Figure 8:
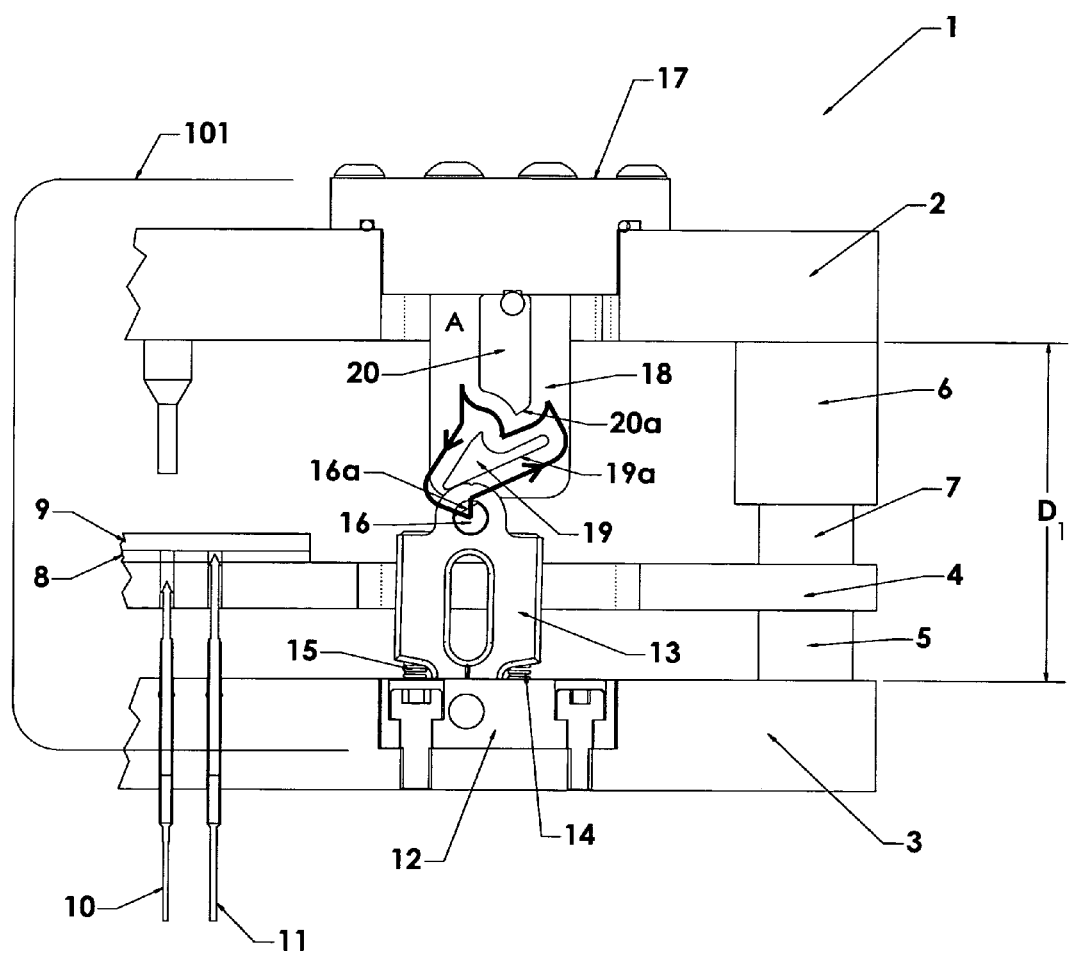
FIG. 8 is a partially cutaway view of the latch mechanism and test fixture showing the path of the cam.

The starting position of the latch 101 is shown in FIG. 1 and in detail in FIG. 7. The cam arm 13 is upright and neutral and is supported by springs 14, 15. The neutral position of the cam 16 is indicated by line X—X in FIG. 7. The cam follower pin 16 is under lower latch piece 19. Lower latch piece 19 has a bottom surface 19a, which slopes upward from one side to the other at an angle $\alpha$, as shown in FIG. 7. The angle in the disclosed embodiment is 24.71 degrees, as measured from the horizontal. Angle $\varnothing$ in the disclosed embodiment is 91.5 degrees when the cam arm 13 is in the neutral position. Cam follower pin 16 in the first embodiment has a sloped surface 16a, which has approximately the same angle as the sloped surface 19a and corresponds to it. The sloped surface 16a helps to ensure that the cam follower pin 16 moves in the desired direction along surface 19a, acting as a directional ensuring device.

Figure 2:
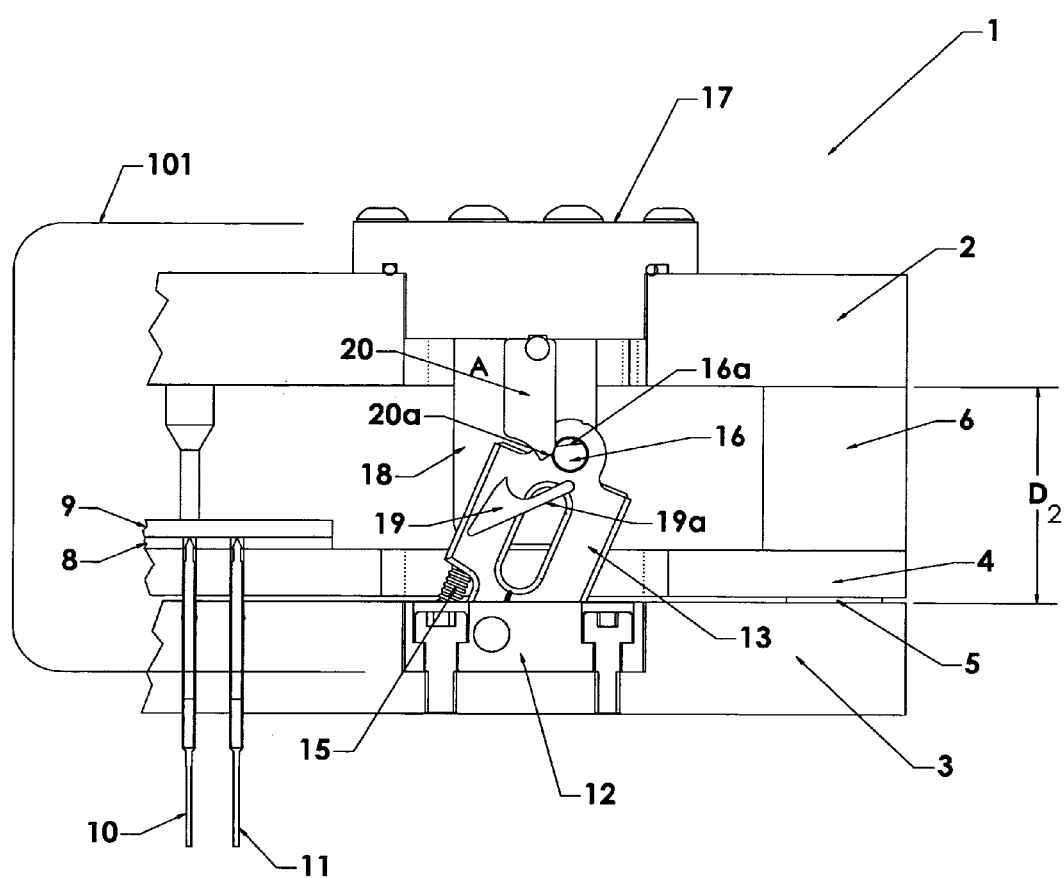
FIG. 2. is a partially cut away view of the latch mechanism and test fixture in the first closed stage.

Distance $D_1$ in the disclosed embodiment is 1.84 inches while no vacuum is applied and the test fixture is not in use. When the vacuum is applied and the top plate 2 is pulled down towards the probe plate 3, the distance between the plates changes to $D_2$, which in the disclosed embodiment is 1.16 inches and the cam moves along lower sloped surface 19a, as shown by arrow Y in FIG. 7. Once cam 16 reaches the top end 19b of lower sloped surface 19a, the springs 14 and 15 attempt to force the cam arm 13 back toward the neutral position. When the test fixture 1 is fully closed for the first closed stage, the cam follower pin 16 rests in the first closed position against the bottom point 20a of upper latch piece 20, as shown in FIG. 2. At this stage the PCA 9 is in contact with both probes 10 and 11, and angle $\varnothing$ is 113 degrees. This is the first testing position.

Figure 3:
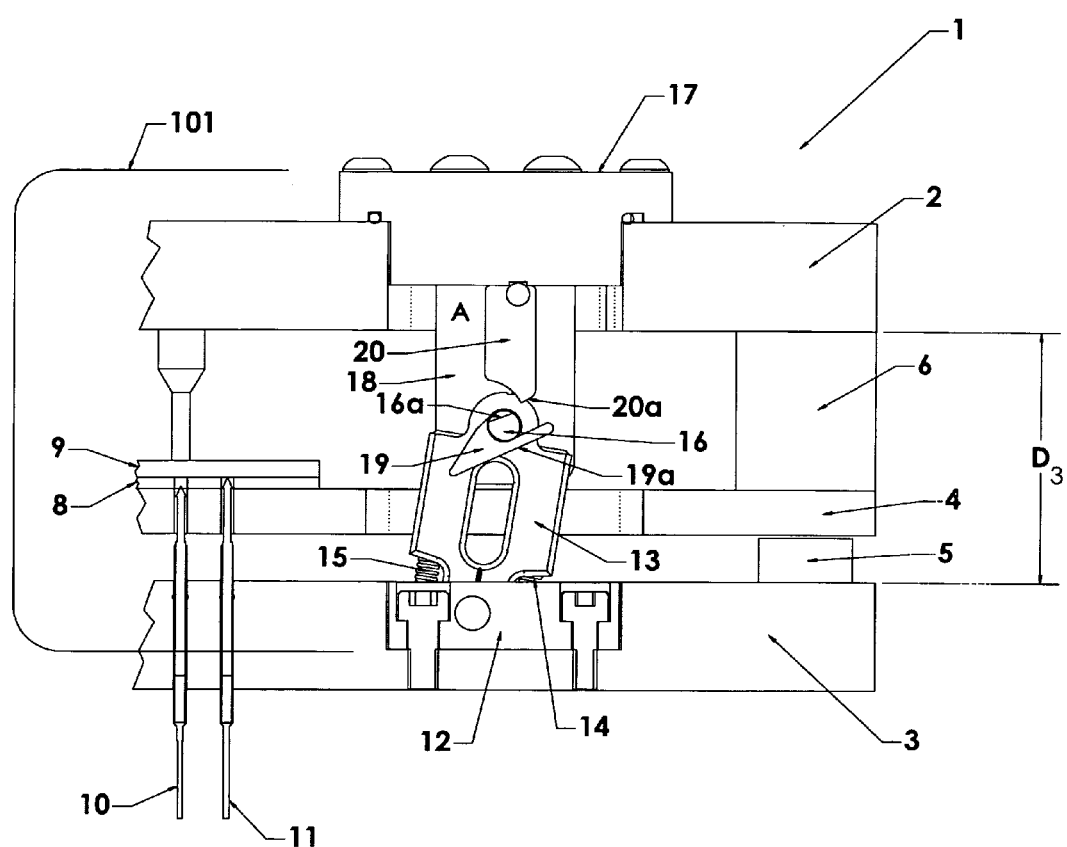
FIG. 3 is a partially cutaway view of the latch mechanism and test fixture in the first release position.

When the vacuum is released the plates 2 and 4 move upward and the cam follower pin 16 will start to move from the first closed position as gaskets 5 and 7 decompress, and cam arm 3 moves toward the neutral position due to springs 14 and 15. Lower latch piece 19 extends beyond upper latch piece 20, as seen in the drawings, so that when the cam follower pin 16 moves it comes in contact with upper sloped surface 19c and moves into pocket 19d, as shown in FIG. 3. Pocket 19d is formed between surfaces 19c and 19e. This prevents any further upward movement of the top plate 2 and holds the test fixture in the first release position, where distance is $D_3$, which is 1.39 inches and angle $\varnothing$ is 99 degrees. This distance is D−x. In this position the normal probe 10 is no longer in contact with the PCA 9, but the longer stroke length dual stage probe 11 is still in contact with the PCA 9. This is the second test position.

Figure 4:
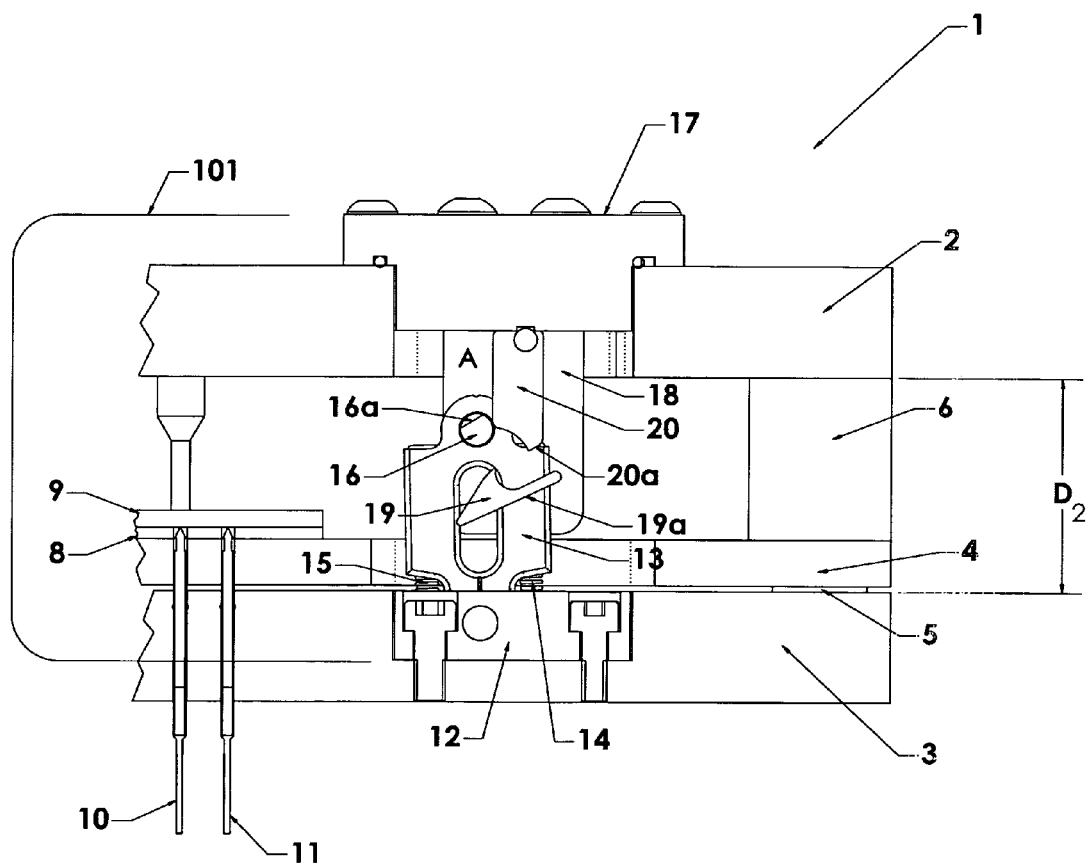
FIG. 4 is a partially cutaway view of the latch mechanism and test fixture in the second closed stage.

In order to release the latch mechanism 101 and start the cycle over again, the vacuum is applied again, moving top plate 2 downward again to the second closed stage, where the distance is $D_2$, which is 1.16 inches, as seen in FIG. 4. This is Dmin. As cam follower pin 16 moves, it is free to move back to approximately the neutral position as it clears the tip on surface 19e. In the event the cam follower pin 16 comes into contact with curved surface 20b on upper latch piece 20, it will move along the curved surface 20b until the cam follower pin 16 reaches the edge 20c of the upper latch piece and rests in the second closed position as shown in FIG. 4. The edge 20c of upper latch piece 20 is approximately lined up with the neutral position of the cam follower pin 16, as shown in FIG. 7. At this point angle ø is 88.75 degrees.

Figure 5:
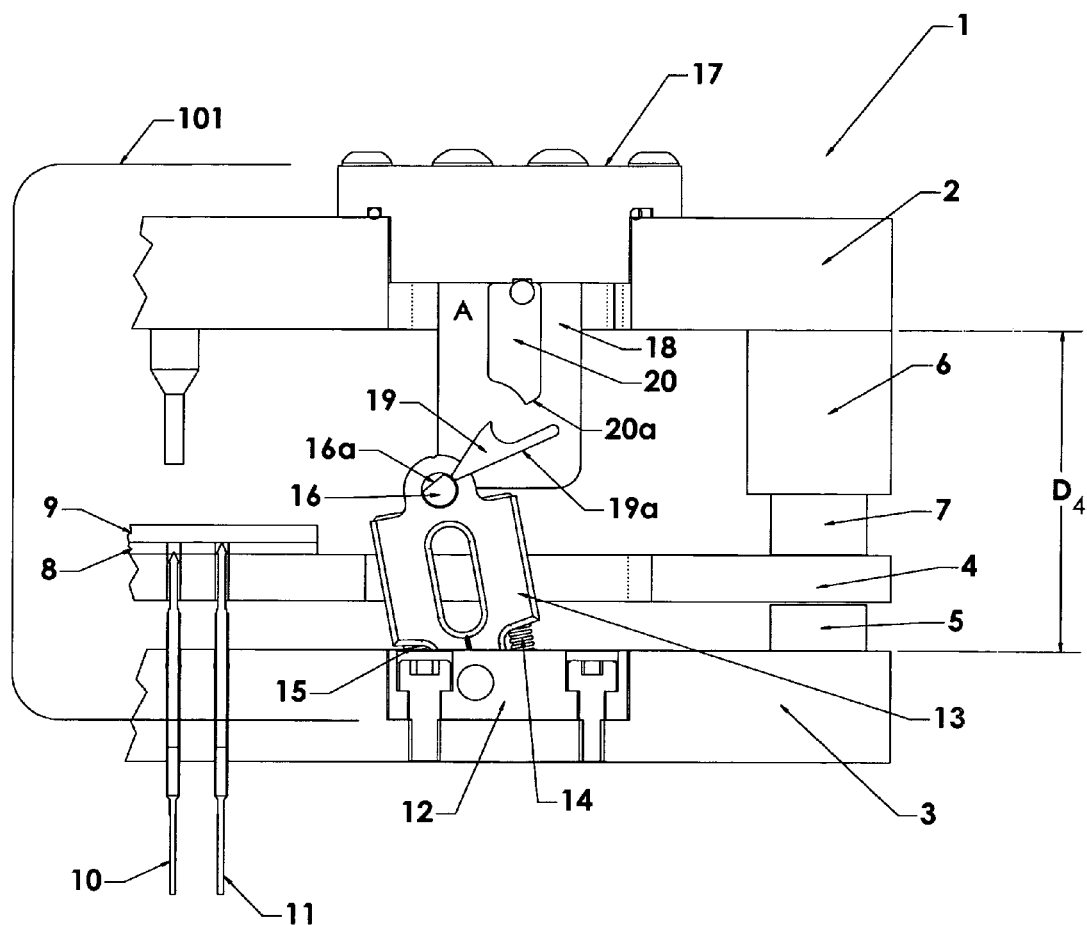
FIG. 5 is a partially cutaway view of the latch mechanism and test fixture during the final release.

When the vacuum is released the second time, the top plate 2 moves upward and the cam follower pin 16 follows surface 19f as shown by arrow z in FIG. 7. When the plates 2, 4 have moved upward enough, the cam follower pin 16 comes around surface 19g and the cam arm 13 returns to the neutral position as shown in FIG. 1, releasing the latch mechanism 101. While the cam follower pin is at surface 19g, distance $D_4$ is 1.72 inches and angle ø is 79.5 degrees as shown in FIG. 5. The approximate path of the cam follower pin 16 through the latch mechanism 101 is shown in arrowed lines in FIG. 8.

In some applications, to ensure that the dual stage latch mechanism 101 operates as desired and the cam follower pin follows the desired path, it is desirable to have additional directional ensuring devices. A second embodiment of the latch 101 has at least two springs to act as directional ensuring devices. Other directional ensuring devices are possible, and would be within the scope of this invention.

Figure 9:
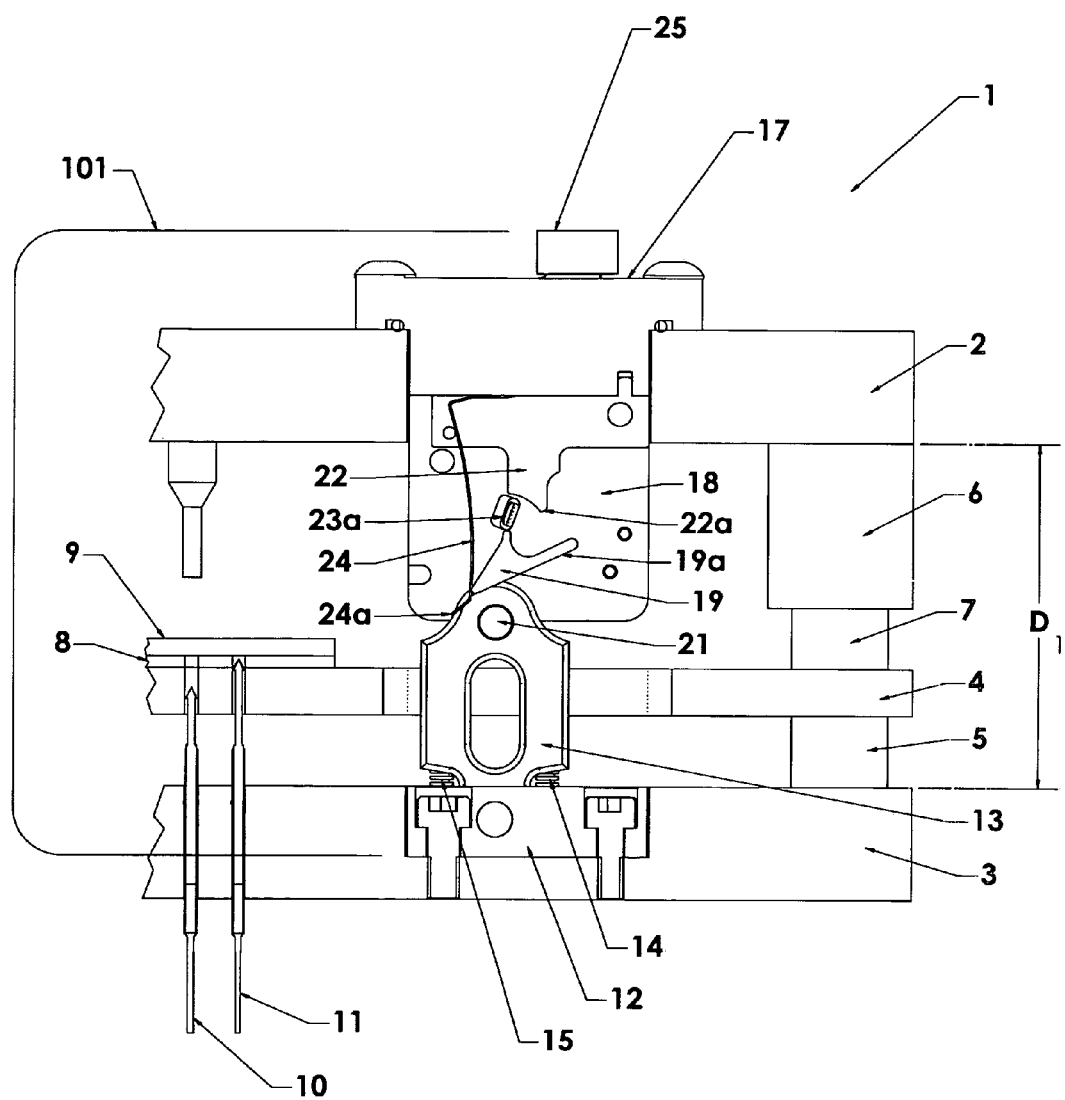
FIG. 9 is a partially cutaway view of a second embodiment of the latch mechanism and test fixture in the neutral position.
Figure 20:
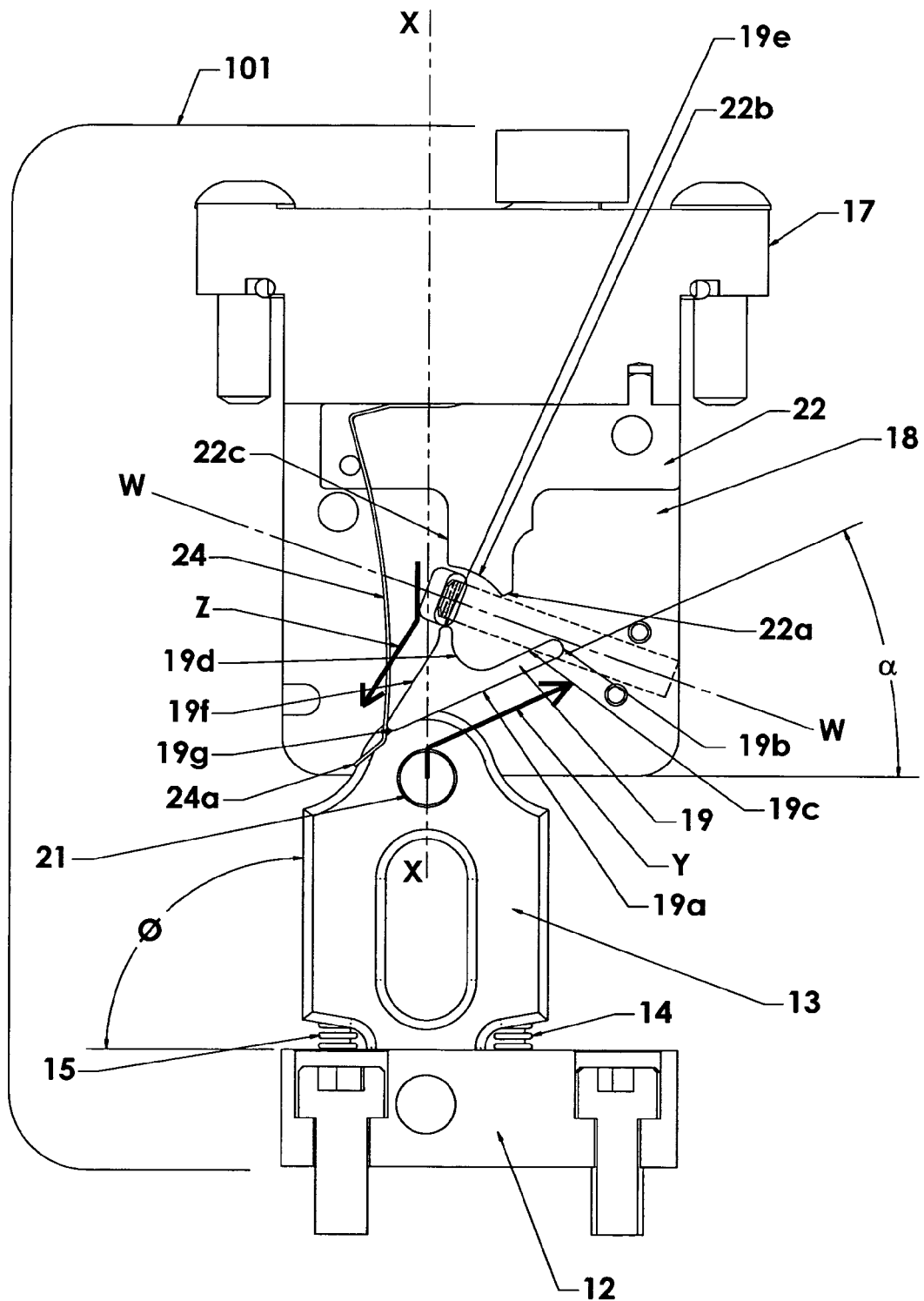
FIG. 20 is a partially cutaway view showing cam details.

The starting position of the second embodiment of the dual stage latch mechanism 101 is shown in FIG. 9 and in detail in FIG. 20. The cam arm 13 is upright and supported by springs 14, 15. The neutral position of the cam follower pin 21 is indicated by line X—X in FIG. 20. The cam follower pin 21 is under lower latch piece 19. Lower latch piece 19 has a bottom surface 19a, which slopes upward from one side to the other at an angle α, as shown in FIG. 20. The angle in the disclosed embodiment is 24.71 degrees, as measured from the horizontal. Angle ø in the disclosed embodiment is 91.5 degrees.

Figure 10:
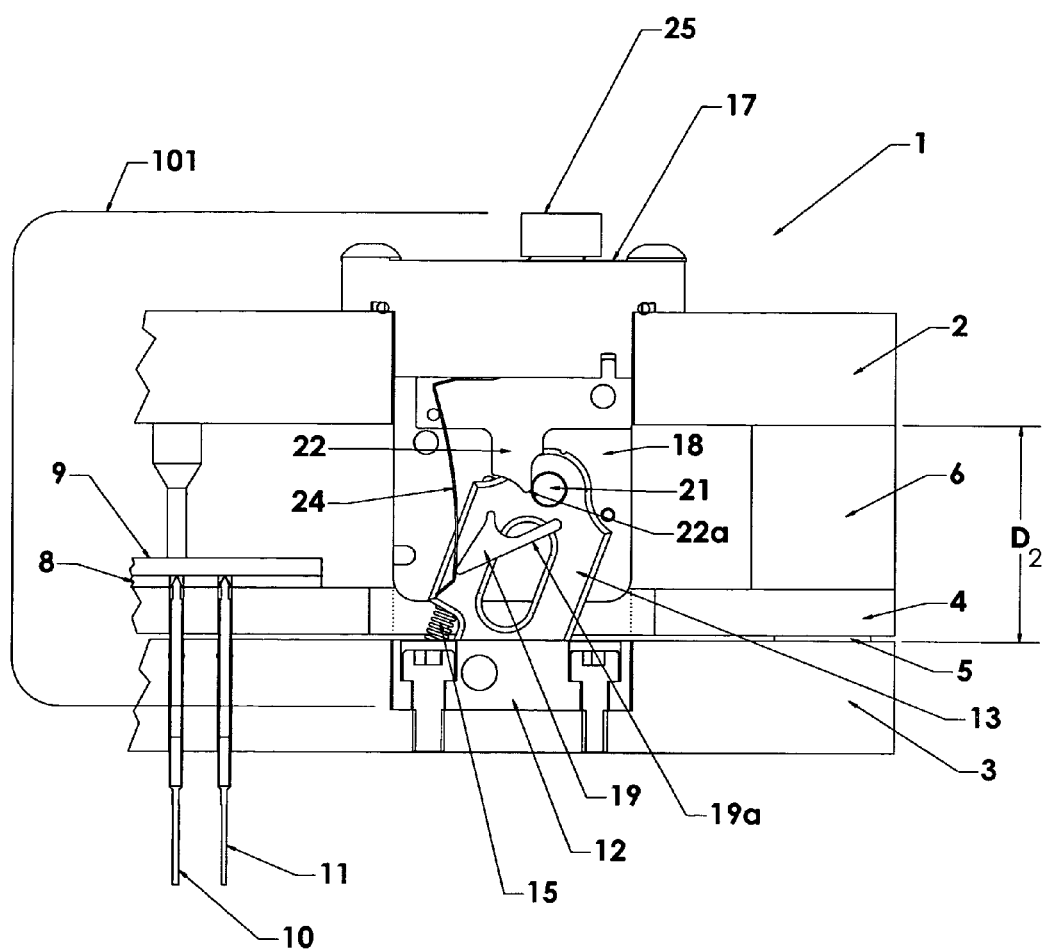
FIG. 10. is a partially cutaway view of the second embodiment of the latch mechanism and test fixture in the first closed stage.

Distance $D_1$ in the disclosed embodiment is 1.84 inches while no vacuum is applied and the test fixture 1 is not in use. When the vacuum is applied and the top plate 2 is moved down towards the probe plate 3, distance D changes to $D_2$, which is 1.16 inches and the cam moves along lower sloped surface 19a, as shown by arrow Y in FIG. 20. Once cam follower pin 21 reaches the top end 19b of lower sloped surface 19a, the springs 14 and 15 attempt to force the cam arm 13 back toward the neutral position. When the test fixture 1 is fully closed for the first closed stage, the cam follower pin 21 rests in the first closed position against the bottom point 22a of upper latch piece 22, as shown in FIG. 10. At this stage the PCA 9 is in contact will both probes 10 and 11, and angle ø is 113 degrees. This is the first testing position and distance D is Dmin.

Figure 11:
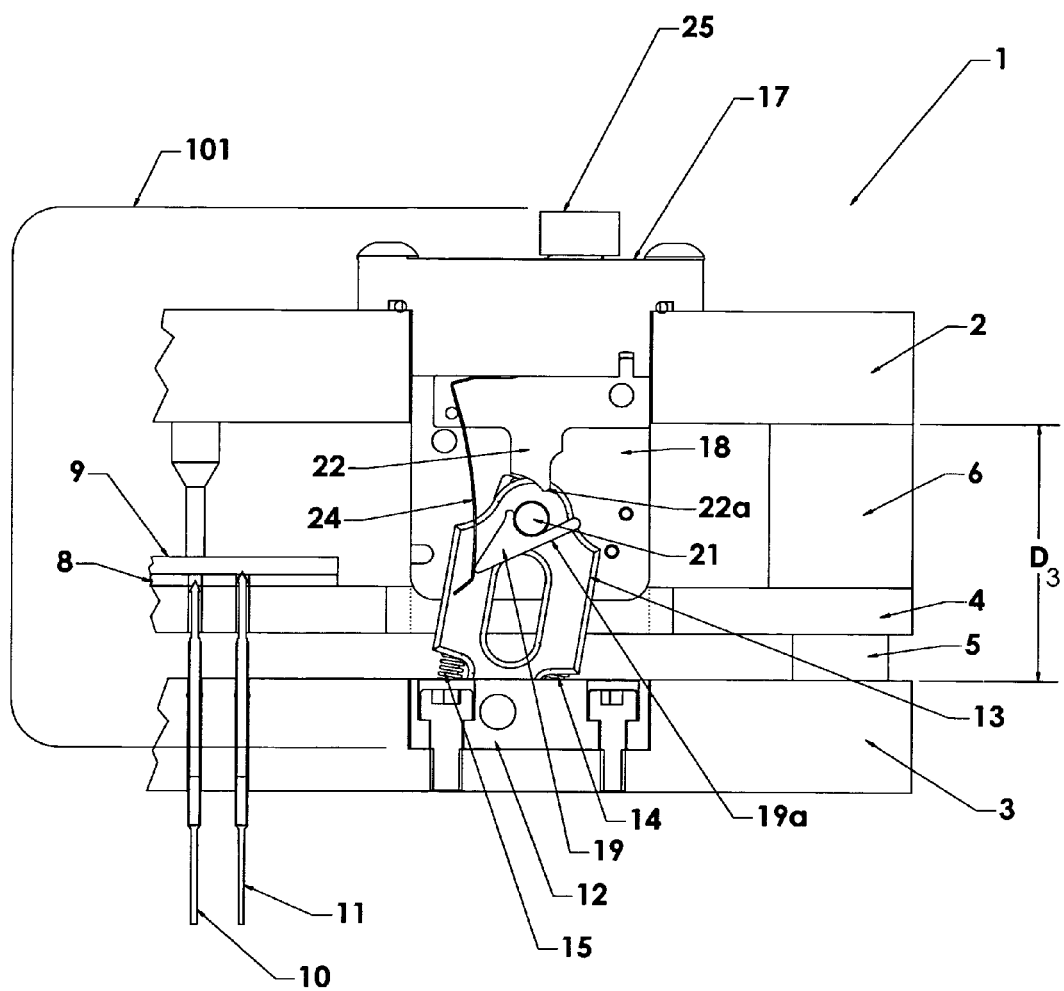
FIG. 11 is a partially cutaway view of the second embodiment of the latch mechanism and test fixture in the first release position.

When the vacuum is released the plates 2 and 4 will move upward, causing cam follower pin 21 to move from the first closed position as gaskets 5 and 7 decompress, and toward the neutral position due to springs 14 and 15. Lower latch piece 19 extends beyond upper latch piece 22, as seen in the drawings, so that when the plates 2, 4 move upward the cam follower pin 21 comes in contact with upper sloped surface 19c and moves into pocket 19d, as shown in FIG. 11. Pocket 19d is formed between surfaces 19c and 19e. This prevents any further upward movement of the top plate 2 and holds the test fixture in the first release position, where distance D is $D_3$, which is 1.39 inches and angle ø is 99 degrees. In this position the normal probe 10 is no longer in contact with the PCA 9, but the longer stroke length dual stage probe 11 is still in contact with the PCA 9. This is the second test position.

Figure 12:
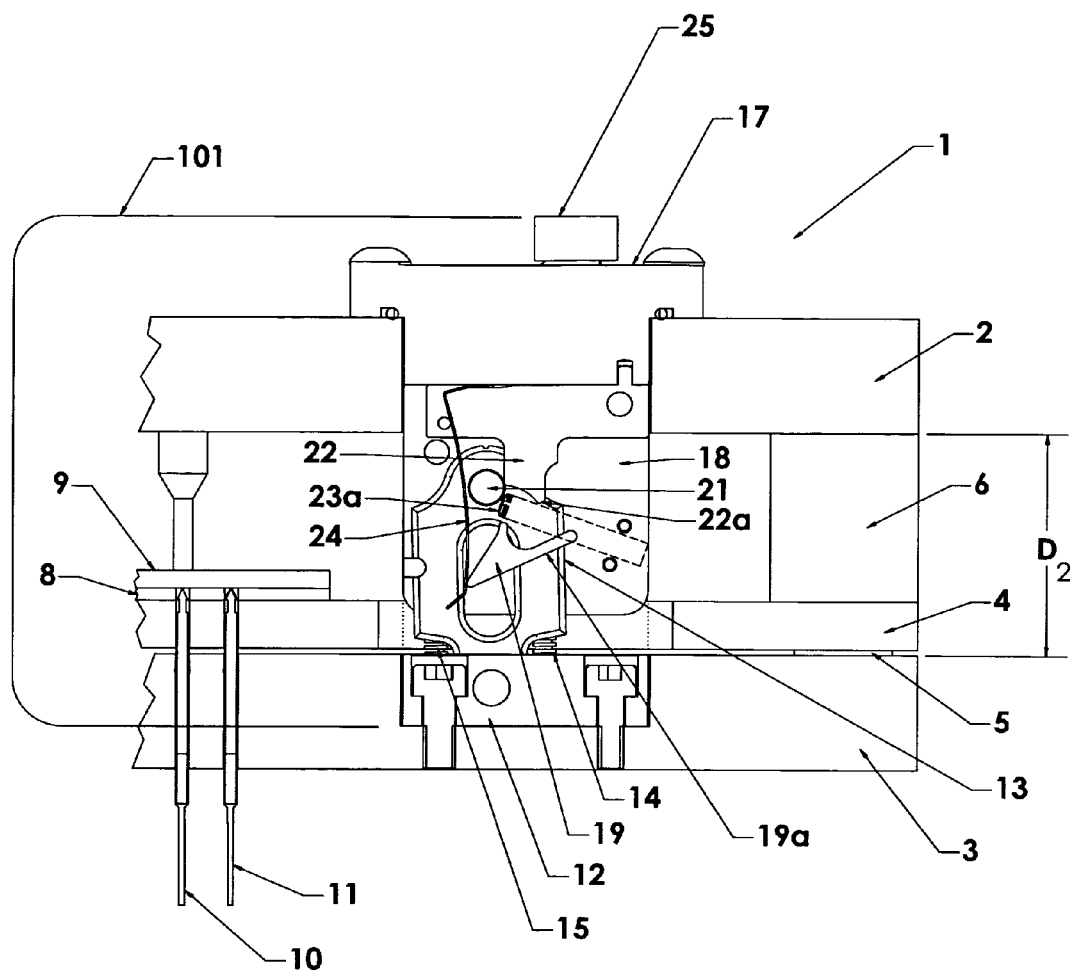
FIG. 12 is a partially cutaway view of the second embodiment of the latch mechanism and test fixture in the second closed stage.

As shown in FIG. 12, next the vacuum is applied again, moving top plate 2 downward again to the second closed stage, where distance D is $D_2$, which is 1.16 inches. As cam follower pin 21 moves, it is free to move back to approximately the neutral position as it clears the tip on surface 19e and moves past spring arm 23, which is seen in FIGS. 9 and 12 and 20. Spring arm 23 is a leaf spring, shown in dotted lines in FIG. 12, and is held in a pocket in latch arm 18b, shown in FIGS. 16, 17, and has a bent tip 23a which extends in to the path of cam follower pin 21 in the disclosed embodiment, but other possible devices could be used. Spring arm 23 can be easily depressed as shown in FIGS. 21 and 22.

Figure 21:
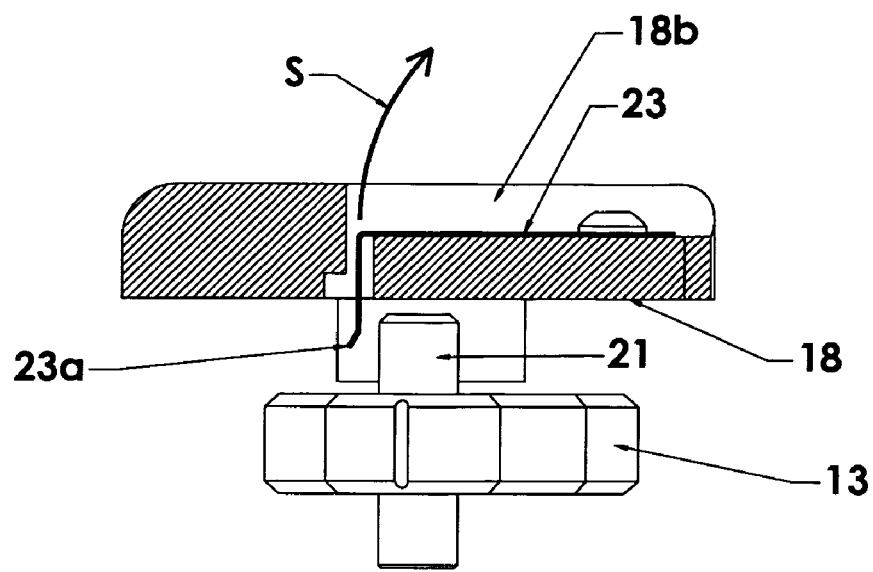
FIG. 21 is a section view at line W—W in FIG. 20, showing cam follower pin 21 in position as shown in FIG. 11.
Figure 22:
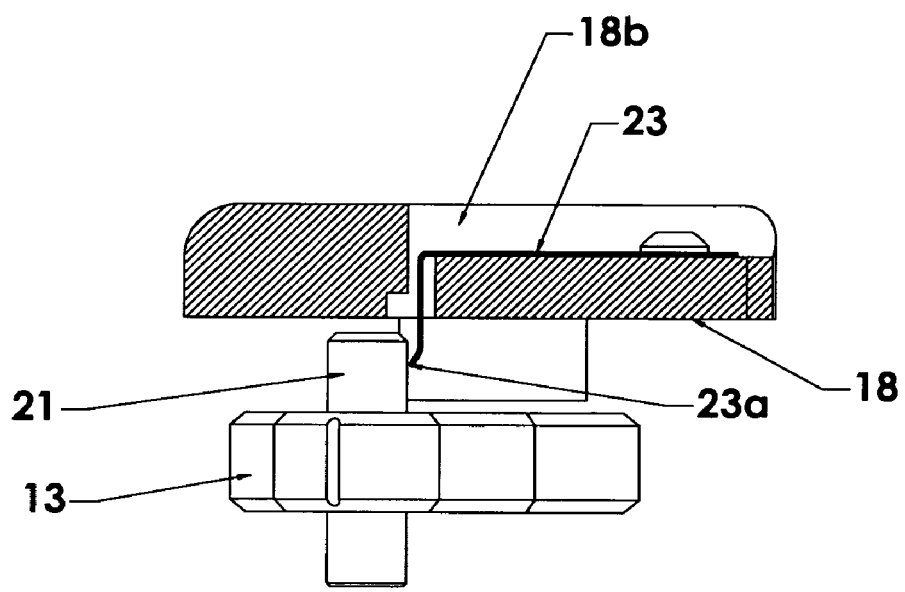
FIG. 22 is a section view at line W—W in FIG. 20, showing cam follower pin 21 in position as shown in FIG. 12.

FIGS. 21 and 22 are a cross section through line w—w of FIG. 20, and show spring arm 23 in place in latch arm 18b and extending through latch arm 18b into the path of cam follower pin 21. The bent tip 23a and the shape and positioning of spring arm 23 allow it to be easily depressed back in the direction of arrow S. Once the cam follower pin 21 passes spring arm 23, as seen in FIG. 22, the spring arm 23 will act as a directional ensuring device, preventing cam follower pin 21 from moving the wrong direction in the next stage.

In the event the cam follower pin 21 comes into contact with curved surface 22b on upper latch piece 22, it will move along the curved surface 22b until the cam follower pin 21 reaches the edge 22c of the upper latch piece and rests in the second closed position as shown in FIG. 12. At this point angle ø is 88.75 degrees. The edge 22c of upper latch piece 22 is approximately lined up with the neutral position of the cam follower pin 21, as shown in FIG. 20.

Figure 13:
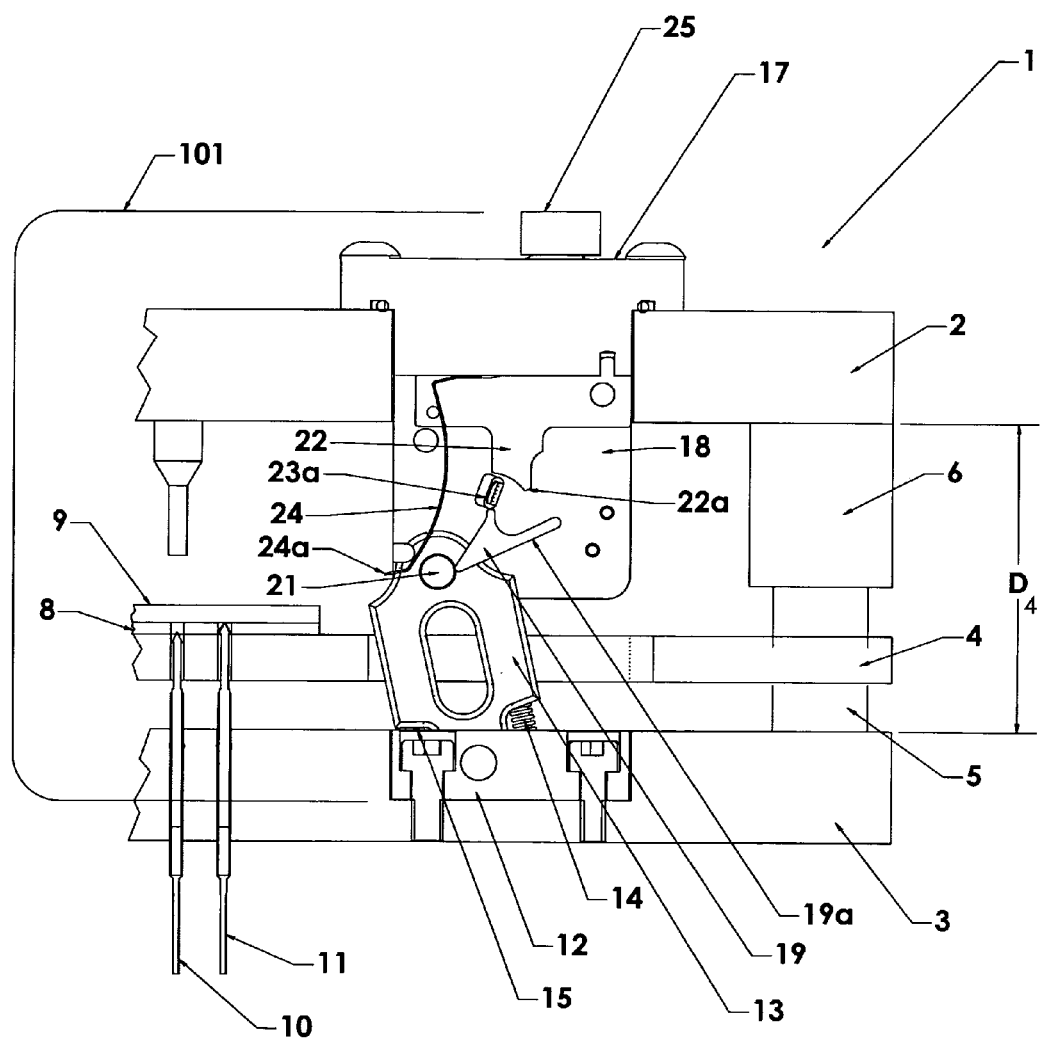
FIG. 13 is a partially cutaway view of the second embodiment of the latch mechanism and test fixture during the final release.

When the vacuum is released the second time, the top plate 2 moves upward and the cam follower pin 21 follows surface 19f as shown by arrow Z in FIG. 20 and as shown in FIG. 13. Spring arm 24 is attached to upper latch piece 22 and extends down and rests on the lower latch piece at point 19g, as shown in FIG. 20. The cam follower pin 21 moves spring arm 24 away from point 19g as the cam follower pin 21 moves downward relative to the spring arm 24, as seen in FIG. 13. Spring arm 24 has a bent end 24a. As seen in FIGS. 9 and 20, the bent end 24a forms an extension of surface 19a. This further decreases the possibility that the cam follower pin 21 could move in the wrong direction in the first stage, shown by arrow Y in FIG. 20. As the cam follower pin 21 passes point 19g, as see in FIG. 13, the spring arm 24 will also force the cam follower pin 21 down and toward the neutral position.

When the cam follower pin 21 travels far enough to come around surface 19g the cam arm 13 returns to the neutral position as shown in FIG. 9. While the cam follower pin 21 is at surface 19g, distance D is $D_4$, which is 1.72 inches and angle ø is 79.5 degrees. The approximate path of the cam follower pin 21 is shown in arrowed lines in FIG. 15.

Figure 14:
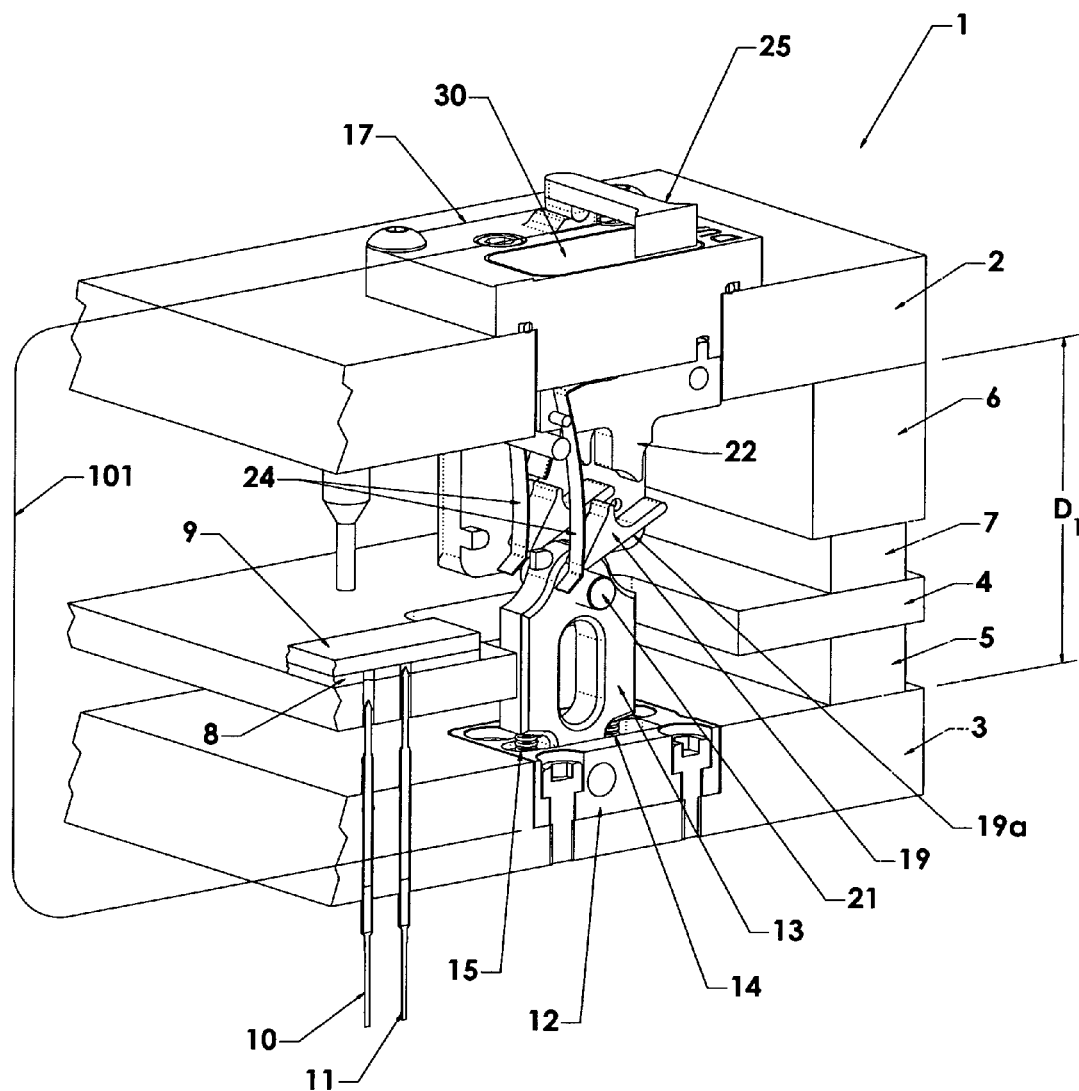
FIG. 14 is a perspective view of the second embodiment of the latch mechanism and test fixture.
Figure 15:
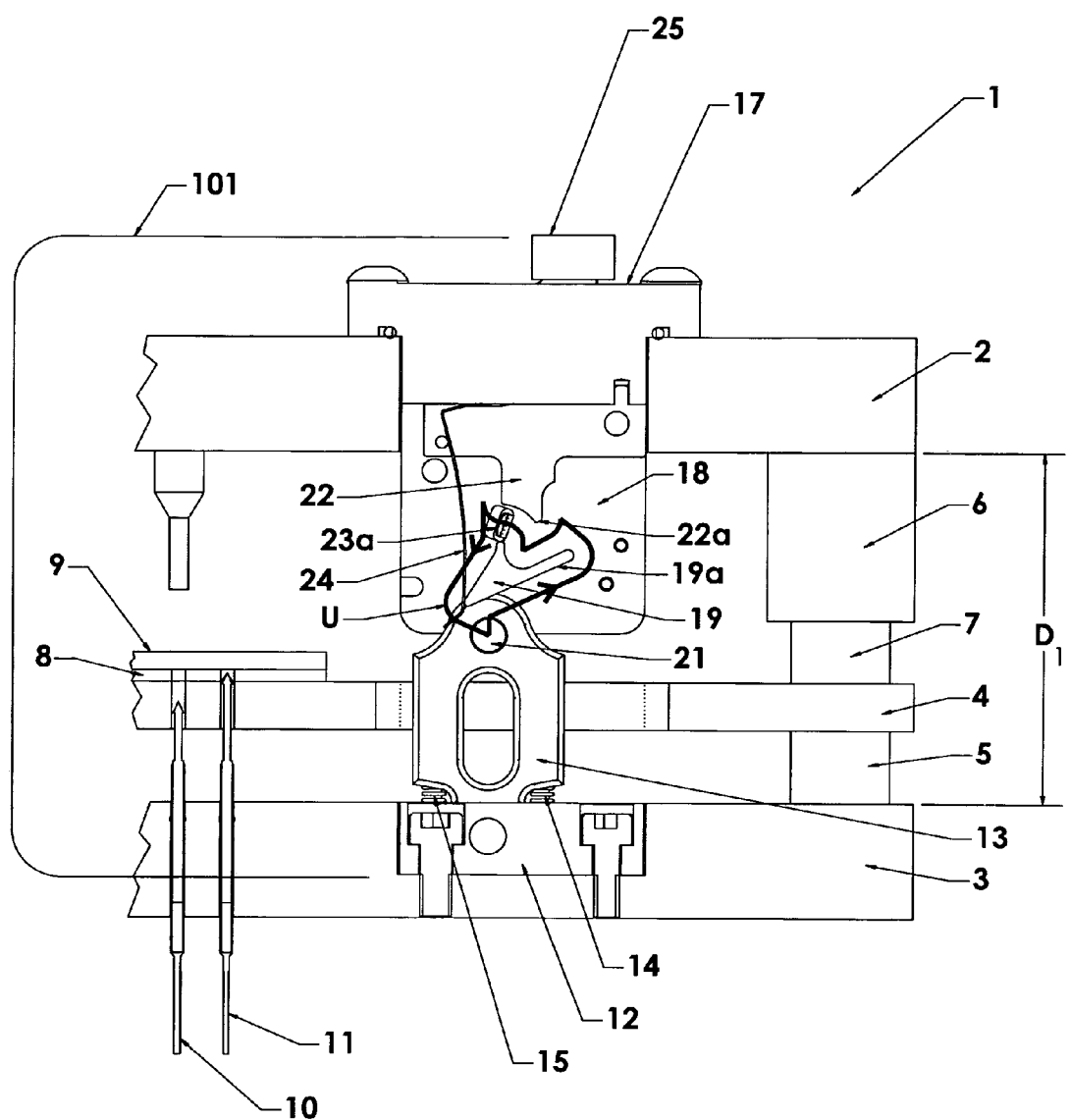
FIG. 15 is a partially cutaway view of the second embodiment of the latch mechanism and test fixture showing the path of the cam.

FIG. 14 shows a perspective view of the second embodiment of the latch 101 with both sets of upper and lower latch pieces visible. Also shown in FIG. 14 is the operating lever 25 for the single/dual stage option.

Figure 23:
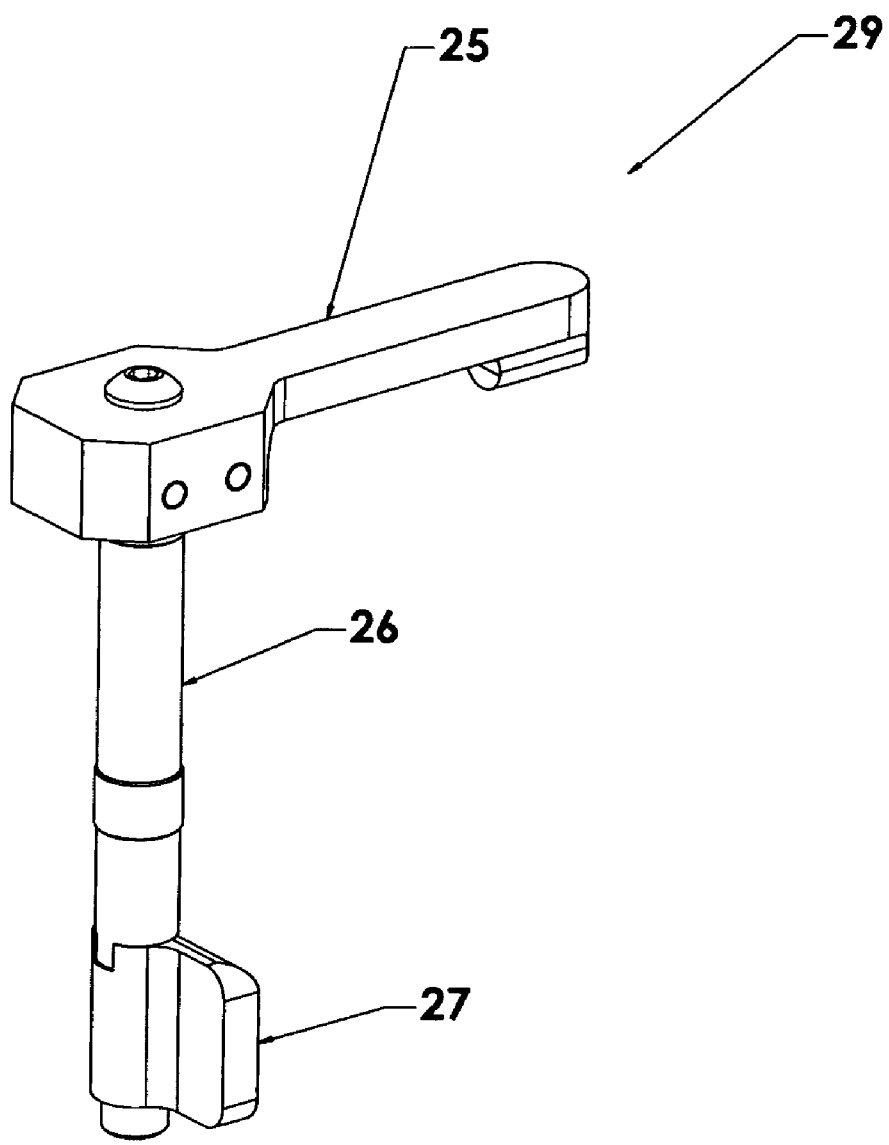
FIG. 23 is a perspective view of the stage selection device.

In some applications it is desirable to have the same latch 101 be able to act as both a single stage latch and a dual stage latch. The present invention allows that by having an optional stage selection device 29 shown in FIG. 23. The stage selection device 29 has the operating lever 25 on the top of the latch 101. The operating lever 25 is connected to a rod 26, shown in dotted lines in FIGS. 16 and 17. The rod 26 is connected to gate 27, shown in FIGS. 16, 17 and 23, which fits inside pocket 28 in latch arm 18a in the dual stage mode, as seen in FIG. 16. If the user wishes to use the latch 101 in a single stage mode, the user would move operating lever 25 from the dual position to the single position, which cause gate 27 to rotate out of the pocket 28, as seen in FIG. 17. This blocks the path of the cam follower pin 21.

Figure 18:
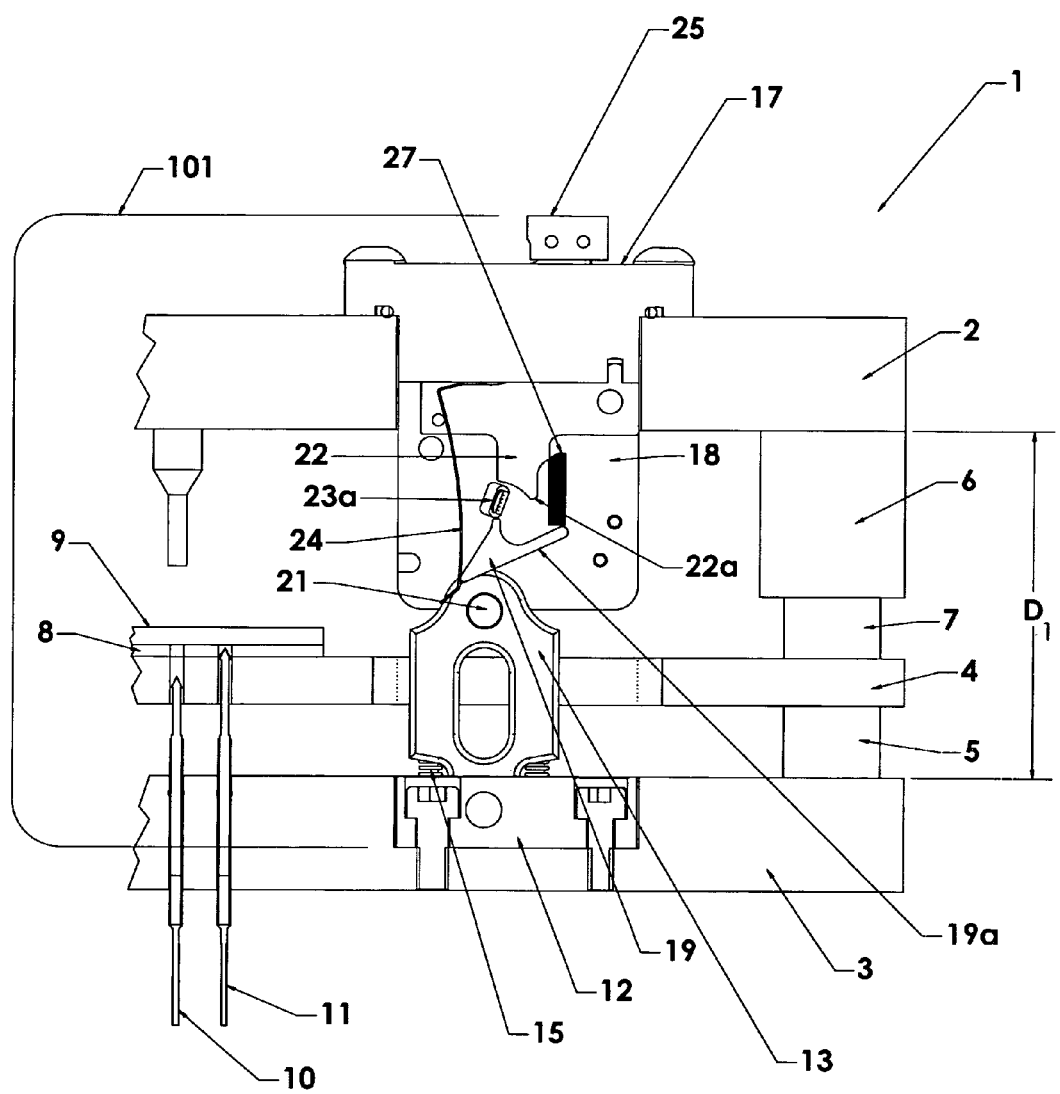
FIG. 18 is partially cutaway view of the second embodiment of latch mechanism with the stage selection switch in the single stage position.
Figure 19:
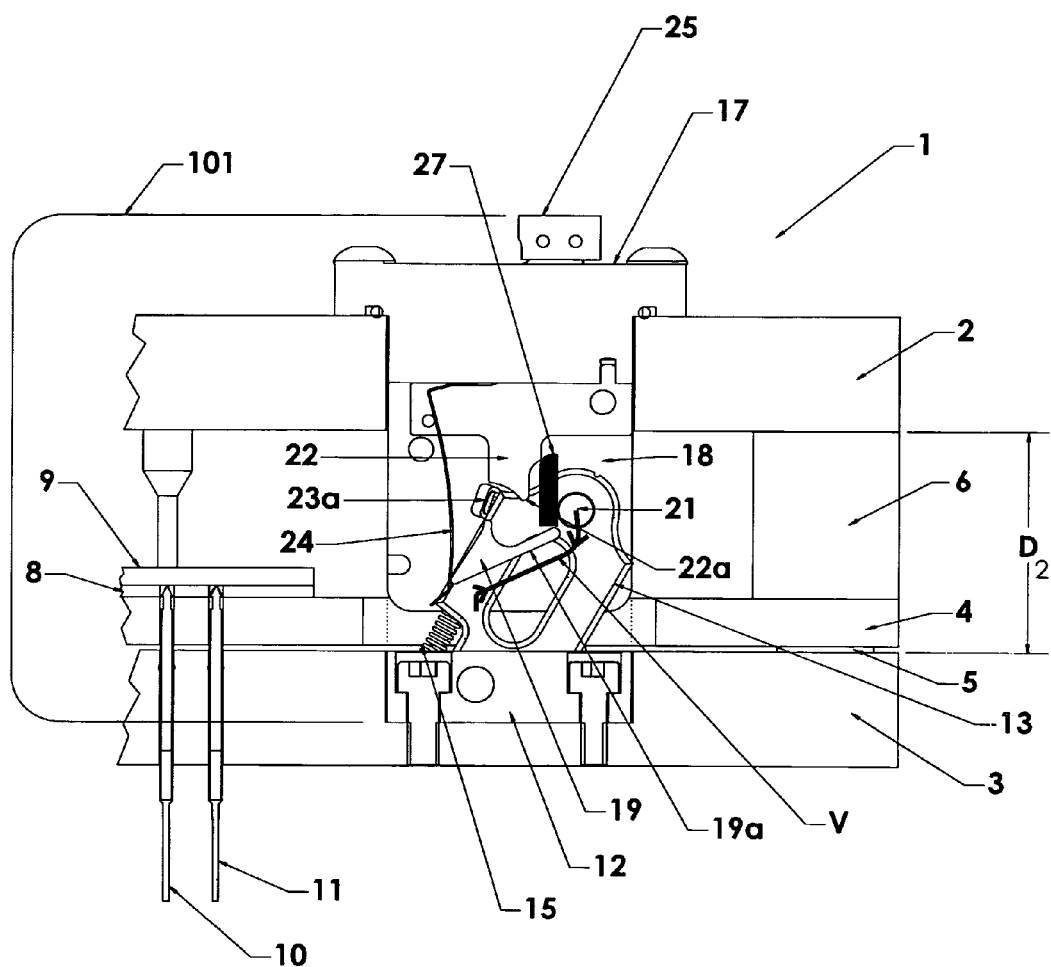
FIG. 19 is a partially cutaway view of the second embodiment of the latch mechanism showing the path of the cam with the stage selection switch in the single stage position.

As seen in FIGS. 17, 18 and 19 the gate 27 blocks the path of the cam follower pin 21 to the second test position and prevents the cam follower pin 21 from taking the path around the lower latch piece 19. This means that the test fixture 1 can only be in the first open position shown in FIG. 18 and with distance D being $D_1$ and the first test position shown in FIG. 19 with distance D being $D_2$. The path of the cam follower pin 21 in the single stage mode is shown by arrow V in FIG. 19.

An additional possible feature of the latch 101 is a window 30, shown in FIG. 14. The window 30 is mounted into block mounting assembly 17 and allows an operator to visually confirm the position of the latch 101 in the cycle. It is possible that during operation one or more of the latches 101 on test fixture 1 get off cycle, which jams the test fixture 1, preventing it from being opened. The window 30 allows the operator to determine which latch 101 is off cycle. The operator can then open the latch 101 with the assembly screws and un-jam the test fixture 1. In the alternative, the if the embodiment has a single/dual stage option, the operation can switch all of the latches 101 to single stage and cycle the test fixture until all latches 101 return to the neutral position and the test fixture 1 can be opened.

In all the depicted embodiments, the latch 101 is mounted in the test fixture 1 with the latch pieces 19 and 22 on the top and the cam arm 13 on the bottom. It is possible to mount the latch 101 in the other orientation, with the cam arm 13 on top. However, it is not possible in this orientation to have the window 30 and be able to see the position of the latch 101 through the window 30.

Another possible variation of the latch, not shown in the figures, would be to have a cam arm which is U shaped and have the came follower pins mounted inward facing on the inside of the U. In this embodiment the upper latch pieces would be mounted on either side of single latch arm extending from the block mounting assembly 17. This embodiment is not believed to be desirable, because it would significantly increase the mass of the cam arm, which would slow the responsiveness of the latch.

The specific angles and distances D disclosed herein are for the specific disclosed embodiments. It is to be understood that with different types of probe pins and with different dual stage latch embodiments, and in by different fixture embodiments the distances and angles will vary.

Although the present invention has been described with reference to disclosed embodiments, numerous modifications and variations can be made and still the result will come within the scope of the invention. No limitation with respect to the specific embodiments disclosed herein is intended or should be inferred. Each apparatus embodiment described herein has numerous equivalents.

We claim:

1. A latch functioning to releasably connect a first parallel plate to a second parallel plate, said latch comprising:

a pivotable cam arm vertically mountable to the second plate;

said cam arm having a spring bias when mounted, with a return position about perpendicular to the second plate, and having a pair of opposing cam follower pins extending from the cam arm;

a pair of latch arms rigidly affixable to a first plate;

wherein a movement of the first plate towards the second plate cause the pair of latch arms to straddle the cam follower pins;

said pair of latch arms each having an inward facing mirrored upper latch piece, followed by a space sufficient to allow the cam follower pins to pass between the upper latch piece and a lower latch piece;

wherein a first open neutral position is defined as a mechanically fixed first separated distance D between the first and second plates;

a first closed position is defined as a distance D minimum between the first and second plate wherein the cam follower pins ride on a bottom surface of the lower latch piece and rest adjacent to the upper latch piece(s) and the cam arm is biased sideways;

a second open position is defined as a distance D–x between the first and second plate wherein the cam follower pins are captured by the lower latch piece, thereby stopping the plates from moving apart greater than distance D–X;

a second closed position is defined as a start of a release cycle wherein the plates are returned to distance D minimum, the cam arm is biased vertically, and the cam follower pin travel along a bottom edge of the upper latch piece to a rest position adjacent to the upper latch piece; and a third open position is defined as a return to the first open position wherein the cam follower pins pass down the lower latch piece and under the lower latch piece, wherein the arm is then biased back to the slightly off a 90° orientation to the second plate, and the plates are returned to distance D.

2. The latch of claim 1, wherein the lower latch piece further comprises an angled bottom surface and a pocket formed in a top surface.

3. The latch of claim 2, wherein the upper latch piece further comprises a sloped bottom edge.

4. The latch of claim 1, wherein the spring bias further comprises a set of springs under a pair of opposing sides of a base of the cam arm.

5. The latch of claim 4 further comprising at least one directional ensuring device.

6. The latch of claim 5, wherein a directional ensuring device is a leaf spring.

7. A latch comprising:

a base means functioning to anchor a cam arm in a pivotable manner about perpendicular to the base means;

a spring means functioning to bias the cam arm about perpendicular to the base means in a neutral position;

a top plate means functioning to rigidly hold a pair of opposing latch arms toward the base means, and move back and forth relative to the base means;

wherein the latch arms straddle the cam arm during the back and forth motion;

the cam arm having at least cam follower pin which rides along an upper and lower latch piece which are affixed to the latch arm;

wherein a force closing the top plate means toward the base means from a distance D to a distance D minimum cause the cam follower pin to ride up the lower latch piece and rest adjacent to the upper latch piece;

wherein a force opening the top plate means away from the base means cause the cam follower pin to catch on the lower latch piece and stop the top plate means from moving all the way to distance D;

wherein a force closing the top plate means a second time cause the cam follower pin to release from the lower latch piece and rest adjacent to the upper latch piece; and wherein a force opening the top plate means a second time causes the cam follower pin to spring back to its neutral position, the top plate means returning to distance D.

8. A latch functioning to releasably connect a first parallel plate to a second parallel plate, said latch comprising:

a pivotable cam arm vertically mountable to the second plate;

said cam arm having a spring bias when mounted, with a return position about perpendicular to the second plate, and having a pair of opposing cam follower pins extending from the cam arm;

at least one latch arm rigidly affixable to a first plate;

wherein a movement of the first plate towards the second plate cause the at least one latch arm to move next to the cam follower pins;

said at least one latch arm each having an upper latch piece, followed by a space sufficient to allow the cam follower pins to pass between the upper latch piece and a lower latch piece;

wherein a first open neutral position is defined as a mechanically fixed first separated distance D between the first and second plates;

a first closed position is defined as a distance D minimum between the first and second plate wherein the cam follower pins ride on a bottom surface of the lower latch piece and rest adjacent to the upper latch piece(s) and the cam arm is biased sideways;

a second open position is defined as a distance D–x between the first and second plate wherein the cam follower pins are captured by the lower latch piece, thereby stopping the plates from moving apart greater than distance D–X;

a second closed position is defined as a start of a release cycle wherein the plates are returned to distance D minimum, the cam arm is biased vertically, and the cam follower pin travel along a bottom edge of the upper latch piece to a rest position adjacent to the upper latch piece; and a third open position is defined as a return to the first open position wherein the cam follower pins pass down the lower latch piece and under the lower latch piece, wherein the arm is then biased back to the slightly off a 90° orientation to the second plate, and the plates are returned to distance D.

\* \* \* \* \*